(12) United States Patent
Uchida

(10) Patent No.: US 8,809,871 B2
(45) Date of Patent: Aug. 19, 2014

(54) SEMICONDUCTOR ELEMENT AND SEMICONDUCTOR DEVICE

(75) Inventor: Masao Uchida, Osaka (JP)

(73) Assignee: Panasonic Corporation, Osaka (JP)

( * ) Notice: Subject to any disclaimer, the term of this patent is extended or adjusted under 35 U.S.C. 154(b) by 243 days.

(21) Appl. No.: 13/519,010

(22) PCT Filed: Oct. 27, 2011

(86) PCT No.: PCT/JP2011/006019
§ 371 (c)(1),
(2), (4) Date: Jun. 25, 2012

(87) PCT Pub. No.: WO2012/056704
PCT Pub. Date: May 3, 2012

(65) Prior Publication Data
US 2012/0286290 A1    Nov. 15, 2012

(30) Foreign Application Priority Data
Oct. 29, 2010    (JP) .................................. 2010-243137

(51) Int. Cl.
*H01L 29/15*    (2006.01)

(52) U.S. Cl.
USPC ....... 257/77; 257/288; 257/607; 257/E29.255

(58) Field of Classification Search
USPC .............................. 257/77, 288, 607, E29.255
See application file for complete search history.

(56) References Cited

U.S. PATENT DOCUMENTS

| | | |
|---|---|---|
| 5,929,690 A | 7/1999 | Williams |
| 2004/0104429 A1 | 6/2004 | Takahashi et al. |
| 2008/0121993 A1 | 5/2008 | Hefner et al. |
| 2008/0224150 A1 | 9/2008 | Suzuki et al. |
| 2009/0101918 A1 | 4/2009 | Uchida et al. |
| 2009/0302376 A1 | 12/2009 | Inoue et al. |
| 2010/0193800 A1 | 8/2010 | Uchida et al. |
| 2011/0198616 A1 | 8/2011 | Yamashita |
| 2012/0057386 A1 | 3/2012 | Adachi et al. |

FOREIGN PATENT DOCUMENTS

| | | |
|---|---|---|
| CN | 101449384 A | 6/2009 |
| CN | 101689565 A | 3/2010 |
| JP | 11-220127 A | 8/1999 |

(Continued)

OTHER PUBLICATIONS

"Fundamentals and Applications of SiC elements", edited by Kazuo Arai and Sadashi Yoshida, Ohmsha Ltd., 2003, p. 206 and English translation.
Supplementary European Search Report for corresponding European Application No. 11835848.0 dated Jul. 26, 2013.

(Continued)

*Primary Examiner* — Tan N Tran

(57) ABSTRACT

A semiconductor element according to the present invention includes: a semiconductor substrate of a first conductivity type; a first silicon carbide semiconductor layer of the first conductivity type on the semiconductor substrate; a body region of a second conductivity type defined in the first silicon carbide semiconductor layer; an impurity region of the first conductivity type defined in the body region; a second silicon carbide semiconductor layer of the first conductivity type on the first silicon carbide semiconductor layer; a gate insulating film on the second silicon carbide semiconductor layer; a gate electrode on the gate insulating film; a first ohmic electrode connected to the impurity region; and a second ohmic electrode on the back surface of the semiconductor substrate. The body region includes first and second body regions. The average impurity concentration of the first body region is twice or more as high as that of the second body region. And the bottom of the impurity region is deeper than that of the first body region.

8 Claims, 13 Drawing Sheets

(56) References Cited

FOREIGN PATENT DOCUMENTS

| | | |
|---|---|---|
| JP | 2001-094097 A | 4/2001 |
| JP | 2002-299625 A | 10/2002 |
| JP | 2004-193578 A | 7/2004 |
| JP | 3941641 B2 | 4/2007 |
| JP | 2008-017237 A | 1/2008 |
| JP | 2009-065185 A | 3/2009 |
| WO | 97/43823 | 11/1997 |
| WO | 2010/044226 A1 | 4/2010 |
| WO | 2010/125819 A1 | 11/2010 |

OTHER PUBLICATIONS

International Search Report for corresponding International Application No. PCT/JP2011/006019 mailed Jan. 24, 2012.
"Fundamentals and Applications of SiC elements", edited by Kazuo Arai and Sadashi Yoshida, Ohmsha Ltd., 2003, p. 206 and concise explanation.
Lendenmann et al., "High-Power SiC Diodes: Characteristics, Reliability and Relation to Material Defects", Materials Science Forum, vols. 389-393 (2002), pp. 1259-1264.
Co-pending U.S. Appl. No. 13/878,742, filed Apr. 10, 2013.
Chinese Search Report for corresponding Chinese Appiication No. 201180005084.2, dated Jun. 3, 2014 and Endiish translation.

(a)

(b)

(c)

30keV:3.0e13cm$^{-2}$
70keV:6.0e13cm$^{-2}$
150keV:1.5e14cm$^{-2}$
350keV:4.0e13cm$^{-2}$

SEMICONDUCTOR ELEMENT AND SEMICONDUCTOR DEVICE

TECHNICAL FIELD

The present invention relates to a semiconductor element and more particularly relates to a silicon carbide semiconductor element (as a power semiconductor device) which can be used in applications that require a high breakdown voltage and a large amount of current.

BACKGROUND ART

Silicon carbide (SiC) is a high-hardness semiconductor material with a greater bandgap than silicon (Si), and has been used extensively in various types of semiconductor devices including power elements, hostile-environment elements, high temperature operating elements, and radio frequency elements. Among other things, the application of SiC to power elements such as semiconductor elements and rectifiers has attracted a lot of attention. This is because a power element that uses SiC can significantly reduce the power loss compared to a Si power element. In addition, by utilizing such properties, SiC power elements can form a smaller semiconductor device than Si power elements.

A metal-insulator-semiconductor field effect transistor (MISFET) is a typical semiconductor element among various power elements that use SiC. In this description, a MISFET of SiC will sometimes be simply referred to herein as a "SiC-FET". And a metal-oxide-semiconductor field effect transistor (MOSFET) is one of those MISFETs.

Somebody reported that if a forward current is supplied to the pn junction of SiC, stacking defects will increase due to basal plane dislocations, which is a problem unique to SiC. Such a problem will arise when a SiC-FET is used as a switching element for a power converter for driving and controlling a load such as a motor. If a SiC-FET is used as a switching element for a power converter, then return current needs to flow when the SiC-FET is in OFF state. And a pn junction inside of a SiC-FET is sometimes used as a path for such a return current. Such a pn junction is present deep inside a semiconductor element that works as the SiC-FET and functions as a kind of diode. That is why the pn junction is called a "body diode". If the pn junction diode (body diode) inside a SiC-FET is used as a freewheeling diode, then current will flow in the forward direction through the body diode that is a pn junction. It is believed that if such current flows through the pn junction of SiC, then the degree of crystallinity of a SiC-FET will decrease (i.e., the number of stacking defects at the pn junction will increase) due to a bipolar operation performed by the body diode (see, for example, Patent Document No. 1 and Non-Patent Documents Nos. 1 and 2).

If the degree of crystallinity of a SiC-FET decreases, the ON voltage of the body diode could rise. Also, if a body diode is used as a freewheeling diode, a reverse recovery current will flow due to the bipolar operation performed by the pn junction diode when the diode in ON state changes into OFF state. And that reverse recovery current causes not only recovery loss but also a decrease in switching rate as well.

Thus, in order to overcome such a problem involved by using a body diode as a freewheeling diode, it was proposed (in Patent Document No. 2, for example) that a return current is made to flow through a freewheeling diode element as an electronic part by connecting the freewheeling diode element and an SiC-FET in anti-parallel with each other.

FIG. 8 illustrates a configuration for a typical inverter circuit 1000 including freewheeling diode elements.

The inverter circuit 1000 is a circuit for driving a load 1500 such as a motor and includes multiple semiconductor elements 1100, which are implemented as SiC-FETs. In this inverter circuit 1000, the semiconductor elements 1100 and freewheeling diode elements 1200 are connected in anti-parallel together. on-state current $I_F$ flows through the semiconductor elements 1100 and return current $I_R$ flows through the freewheeling diode elements 1200. Two semiconductor elements 1100 that are connected in series together form one set of semiconductor elements. And three sets of semiconductor elements are arranged in parallel with each other with respect to a DC power supply 2000. The gate electric potential of each of these semiconductor elements 1100 is controlled by a controller.

FIG. 9 illustrates the structure of a semiconductor element (SiC-FET) 1100. This semiconductor element 1100 is made of silicon carbide (SiC) semiconductors and has a structure in which an $n^-$-silicon carbide semiconductor layer 120 has been stacked on an $n^+$-substrate (SiC substrate) 110. A p-body region 130 has been defined in an upper part of the $n^-$-silicon carbide semiconductor layer 120. A p-body contact region 132 and an $n^+$ impurity region 140 have been defined in an upper part of the p-body region 130. And a first ohmic electrode 145 is arranged on the p-body contact region 132 and the $n^+$-impurity region 140.

An epitaxial channel layer 150 has been formed to cover the surface of the $n^-$ silicon carbide semiconductor layer 120, the p-body region 130 and the $n^+$-impurity region 140. A gate insulating film 160 and a gate electrode 165 are further arranged on the epitaxial channel layer 150. A portion of the epitaxial channel layer 150, which contacts with the upper surface of the p-body region 130, functions as a channel region. On the back surface of the $n^+$-substrate 110, arranged is a second ohmic electrode 170.

A body diode 180 has been formed inside of this semiconductor element 1100. Specifically, the pn junction between the p-body region 130 and the $n^-$-silicon carbide semiconductor layer 120 forms the body diode 180.

Since SiC is a wide bandgap semiconductor, the body diode 180 has a relatively high turn-on voltage Vf of around 3 V (e.g., approximately 2.7 V) at room temperature and would cause a lot of loss. In this case, the turn-on voltage Vf is defined to be the electric potential Vsd at the first ohmic electrode 145 with respect to the one at the second ohmic electrode 170.

FIG. 10 shows the current-voltage characteristics and turn-on voltages of the body diode 180 at multiple different operating temperatures thereof. The turn-on voltage Vf of the body diode 180, which is obtained by making a tangential approximation on a curve representing its current-voltage characteristic, is as high as about 2.8 V at 25° C. A diode with such a high turn-on voltage is not practical. The higher the operating temperature, the smaller Vf. Also, as mentioned above, if the body diode 180 is used as a freewheeling diode, the degree of crystallinity of the semiconductor element 1100 will continue to decrease, the body diode 180 will have increased electrical resistance, and the loss will increase, too, which is a problem.

For that reason, it is difficult to replace the freewheeling diode element 1200 of the inverter circuit 1000 with the body diode 180.

The body diode 180 is a pn junction diode and is also an element that performs a bipolar operation. When the body diode 180 turns OFF, a reverse recovery current flows, thus causing some recovery loss. As a result, as there is a period in which the reverse recovery current flows, it becomes very difficult to switch the semiconductor element 1100 at high rates. In addition, since the switching loss increases, it becomes difficult to increase the switching frequency, too.

FIG. 11 is a circuit diagram illustrating a part of the configuration shown in FIG. 8 for illustration purposes. In FIG. 11, the DC power supply 2000 supplies power to an inductive load 2100 such as a motor. A high-side MISFET H and a low-side MISFET L are connected in series together. A controller 2200 that drives the high-side MISFET H and the low-side MISFET L outputs a gate drive voltage Vg1 to the high-side MISFET H and a gate drive voltage Vg2 to the low-side MISFET L, respectively.

The controller 2200 and the DC power supply 2000 together function as a "electric potential setting section" for setting the electric potentials of respective MOSFETs (i.e., semiconductor elements). And the semiconductor device shown in FIG. 11 is driven by that electric potential setting section.

Each of the currents I1 and I2 indicated by the arrows in FIG. 11 is supposed to have a positive value when flowing in the direction indicated by the arrow and a negative value when flowing in the opposite direction to the one indicated by the arrow, respectively.

Portions (a) through (e) of FIG. 12 show the operating waveforms of the circuit shown in FIG. 11 and illustrate a timing diagram showing voltages applied to, and currents flowing through, respective parts of the circuit when a current needs to be supplied to the inductive load 2100.

The respective gate drive voltages Vg1 and Vg2 for the high-side MISFET H and the low-side MISFET L are turned ON and OFF exclusively. In addition, a dead time Td1, Td2 is provided between Vg1 and Vg2 to prevent the high-side and low-side MISFETs H and L from turning ON simultaneously and causing a short-circuit breakdown.

In the initial state indicated by the timing diagram shown in FIG. 12, Vg2 is ON state to make a current flow in the path indicated by the arrow 96 shown in FIG. 11. Next, during the dead time Td1 after Vg2 has fallen to OFF state, current flows in the path indicated by the arrow 97 shown in FIG. 11. That is to say, the current flows through the freewheeling diode element that is connected anti-parallel to the low-side MISFET L. In that case, the current I1 has a negative value.

If the high-side MISFET H is turned ON while current is flowing through the freewheeling diode element that is connected anti-parallel to the low-side MISFET L, a voltage is applied to that freewheeling diode element that is connected anti-parallel to the low-side MISFET L. This voltage is a reverse voltage for the freewheeling diode element. That is why after a reverse recovery current has flowed through the freewheeling diode element that is connected anti-parallel to the low-side MISFET L along the path indicated by the arrow 95 shown in FIG. 11, that freewheeling diode that is connected anti-parallel to the low-side MISFET L turns OFF. More specifically, when the high-side MISFET H turns ON, the reverse recovery current flows from the high-side MISFET H through the freewheeling diode element that is connected anti-parallel to the low-side MISFET L as a sort of transient current, which is illustrated as a peak current 98. This reverse recovery current never flows through the inductive load 2100. However, as indicated by the arrow 95 in FIG. 11, the reverse recovery current is superposed on the current flowing through the high-side MISFET H, thus causing an increase in switching loss, a breakdown of the element due to overcurrent, and a lot of noise.

When the freewheeling diode element that is connected anti-parallel to the low-side MISFET L turns OFF, current flows along the path indicated by the arrow 94 in FIG. 11. Next, during the dead time Td2 after Vg1 has fallen to OFF state, current flows along the path indicated by the arrow 97 shown in FIG. 11, i.e., through the freewheeling diode element that is connected anti-parallel to the low-side MISFET L.

When the low-side MISFET L turns ON while current is flowing through the freewheeling diode element that is connected anti-parallel to the low-side MISFET L, a current flows along the path indicated by the arrow 96 shown in FIG. 11, i.e., through the channel of the low-side MISFET L. As a result, the initial state is recovered. It should be noted that although the high-side MISFET H and the low-side MISFET L turn ON and OFF at mutually different times, the reverse recovery current is also generated on the high side, and therefore, current does flow through the freewheeling diode element on the high side.

Next, the reverse recovery current of a pn junction diode will be described with reference to FIG. 13, in which curves (a) and (b) show variations in the amount of current flowing through a pn junction diode of Si (which is labeled as Si-PND). Specifically, the curve (a) shows the results obtained at 25° C. ($T_j$=25° C.) and the curve (b) shows the results obtained at 150° C. ($T_j$=150° C.).

As indicated by these curves (a) and (b), a pn junction diode has a period in which a reverse recovery current is generated, thus deteriorating the performance of the inverter circuit 1000 (e.g., interfering with the high-rate switching and increasing the switching loss). The magnitude of the reverse recovery current indicated by the 150° C. curve (b) is greater than what is indicated by the 25° C. curve (a). That is why the higher the temperature, the more seriously the characteristic of the Si-pn junction diode is affected.

On the other hand, the curve (c) shown in FIG. 13 shows a variation in the amount of current flowing through a Schottky barrier diode of SiC (which is labeled as SiC-SBD). As indicated by the curve (c), the magnitude of the reverse recovery current generated in that case is smaller than what is indicated by the curve (a) or (b). In addition, since the curve (c) shows both of the results that were obtained at 25° C. and 150° C., it can be seen that almost no reverse recovery current is generated in the SiC-SBD even at high temperatures. For that reason, a SiC-SBD, rather than Si-PND, had better be used as the freewheeling diode element 1200.

CITATION LIST

Patent Literature

Patent Document No. 1: Japanese Laid-Open Patent Publication No. 2008-17237
Patent Document No. 2: Japanese Laid-Open Patent Publication No. 2002-299625

Non-Patent Literature

Non-Patent Document No. 1: Fundamentals and Applications of SiC elements, edited by Kazuo Arai and Sadashi Yoshida, Ohmsha, Ltd., 2003, p. 206
Non-Patent Document No. 2: Materials Science Forum Vols. 389-393 (2002), pp. 1259-1264

SUMMARY OF INVENTION

Technical Problem

The SiC semiconductor device disclosed in Patent Document No. 2 uses a SiC-SBD as a freewheeling diode element.

An SBD has a lower turn-on voltage than a SiC-FET body diode. That is why if the amount of return current is small, then the return current will flow through the SBD and will not flow through the body diode. However, if a SiC-SBD is used as the freewheeling diode element, the circuit cost should increase because silicon carbide semiconductor materials themselves, and therefore SiC-SBDs, are too expensive. Furthermore, if the SiC-FET disclosed in Patent Document No. 2 is used to make a power converter, the failure rate of the SiC-FET will increase when return current flows through the body diode. Thus, it cannot be said that the reliability of such a power converter is high. On top of that, since the number of components to use increases by introducing the SiC-SBD, the power converter comes to have an increased size, which is contrary to the recent downsizing and weight reduction trends of power converters.

It is therefore a primary object of the present invention to overcome at least one of these problems with the pertinent art by providing a SiC semiconductor element that can maintain high reliability by minimizing the deterioration of crystallinity of a SiC semiconductor device.

Another object of the present invention is to provide a SiC semiconductor element that can operate at high rates with the loss cut down.

Solution to Problem

A semiconductor element according to the present invention includes: a semiconductor substrate of a first conductivity type; a first silicon carbide semiconductor layer of the first conductivity type which is arranged on the principal surface of the semiconductor substrate; a body region of a second conductivity type which is defined in the first silicon carbide semiconductor layer; an impurity region of the first conductivity type which is defined in the body region; a second silicon carbide semiconductor layer of the first conductivity type which is arranged on the first silicon carbide semiconductor layer so as to be at least partially in contact with the body region and the impurity region; a gate insulating film which is arranged on the second silicon carbide semiconductor layer; a gate electrode which is arranged on the gate insulating film; a first ohmic electrode which is electrically connected to the impurity region; and a second ohmic electrode which is arranged on the back surface of the semiconductor substrate. The body region of the second conductivity type includes a first body region that contacts with the surface of the first silicon carbide semiconductor layer and a second body region that contacts with the bottom of the body region of the second conductivity type. The average impurity concentration of the first body region is twice or more as high as the average impurity concentration of the second body region. And the bottom of the impurity region is located at a deeper level than the bottom of the first body region.

In one preferred embodiment, supposing electric potentials applied to the second ohmic electrode and the gate electrode with respect to the electric potential of the first ohmic electrode are identified by Vds and Vgs, respectively, and a gate threshold voltage is identified by Vth, in the case where Vgs≥Vth is satisfied, current flows from the second ohmic electrode toward the first ohmic electrode via the second silicon carbide semiconductor layer. In the case where 0 volts≤Vgs<Vth is satisfied, current flows from the first ohmic electrode toward the second ohmic electrode via the second silicon carbide semiconductor layer before current starts to flow from the body region toward the first silicon carbide semiconductor layer as Vds becomes even smaller than 0 volts.

In one preferred embodiment, the semiconductor substrate, the first silicon carbide semiconductor layer, the body region, the impurity region, the second silicon carbide semiconductor layer, the gate insulating film, the gate electrode, the first ohmic electrode, and the second ohmic electrode together form a metal-insulator-semiconductor field effect transistor. Supposing the electric potential of the second ohmic electrode with respect to the electric potential of the first ohmic electrode is identified by Vds, the electric potential of the gate electrode with respect to the electric potential of the first ohmic electrode is identified by Vgs, the gate threshold voltage of the metal-insulator-semiconductor field effect transistor is identified by Vth, the direction of a current flowing from the second ohmic electrode toward the first ohmic electrode is defined to be a forward direction, and the direction of a current flowing from the first ohmic electrode toward the second ohmic electrode is defined to be a reverse direction, in the case where Vgs≥Vth, the metal-insulator-semiconductor field effect transistor makes the first and second ohmic electrodes electrically conductive with each other via the second silicon carbide semiconductor layer. And in the case where 0 volts≤Vgs<Vth, the metal-insulator-semiconductor field effect transistor functions as a diode that does not make a current flow in the forward direction but makes a current flow in the reverse direction from the first ohmic electrode toward the second ohmic electrode via the second silicon carbide semiconductor layer when Vds<0 volts. The absolute value of the turn-on voltage of the diode is smaller than the absolute value of the turn-on voltage of the body diode that is formed by the body region and the first silicon carbide semiconductor layer.

In one preferred embodiment, the first body region has an average impurity concentration of $1\times10^{18}$ cm$^{-3}$ to $1\times10^{20}$ cm$^{-3}$ and the second body region has an average impurity concentration of $1\times10^{17}$ cm$^{-3}$ to $1\times10^{19}$ cm$^{-3}$.

In one preferred embodiment, the second silicon carbide semiconductor layer is electrically connected to the impurity region and a portion of the first silicon carbide semiconductor layer that is adjacent to the first body region and is arranged on the first body region.

In one preferred embodiment, the second silicon carbide semiconductor layer has been grown epitaxially.

In one preferred embodiment, the first and second body regions have thicknesses of at least 15 nm and at least 100 nm, respectively, as measured perpendicularly to the principal surface of the semiconductor substrate.

In one preferred embodiment, when viewed perpendicularly to the principal surface of the semiconductor substrate, the first and second body regions have contours that match with each other.

A semiconductor device according to the present invention includes a plurality of semiconductor elements according to any of the preferred embodiments described above. In each of those semiconductor elements, the semiconductor substrate and the first silicon carbide semiconductor layer are connected together. And in a plane that is parallel to the principal surface of the semiconductor substrate, a ring region of the second conductivity type has been defined in the first silicon carbide semiconductor layer so as to surround those semiconductor elements. The dopant profile in the depth direction of the ring region is the same as that of the body region.

Advantageous Effects of Invention

According to the present invention, diode current is made to flow through a channel, not a body diode formed by a pn junction, and therefore, the turn-on voltage becomes lower than that of the body diode and the conduction loss can be reduced. In addition, since a lot of diode current can be made to flow through the second silicon carbide semiconductor layer, the increase in the number of crystal imperfections that would otherwise be caused by supplying a forward current to the pn junction between the body region and the first silicon carbide semiconductor layer can be avoided. On top of that, since the p-body region is made up of two regions, the respective concentrations of the first body region that controls the threshold value and the second body region that forms a pn junction with the drift layer can be controlled independently of each other. As a result, the breakdown voltage or leakage current problem with the semiconductor element can be overcome.

DESCRIPTION OF EMBODIMENTS

A semiconductor element according to the present invention includes a MISFET that is formed by a silicon carbide semiconductor layer functioning as a channel region, a gate electrode that controls current flowing through the silicon carbide semiconductor layer, and first and second ohmic electrodes that are electrically connected to the silicon carbide semiconductor layer. If the electric potential of the gate electrode with respect to the electric potential of the first ohmic electrode is equal to or greater than zero but less than the threshold voltage Vth of the transistor, this MISFET functions as a diode that makes a current flow from the first ohmic electrode toward the second ohmic electrode via the channel region.

In this description, the electric potential of the second ohmic electrode D with respect to the electric potential of the first ohmic electrode S will be identified herein by Vds. The electric potential of the gate electrode G with respect to the electric potential of the first ohmic electrode S will be identified herein by Vgs. The direction of a current flowing from the second ohmic electrode D toward the first ohmic electrode S is defined to be a "forward direction". And the direction of a current flowing from the first ohmic electrode S toward the second ohmic electrode D is defined to be a "reverse direction". It should be noted that both electric potentials and voltages are expressed in volts (V).

Embodiment 1

Figure 1:
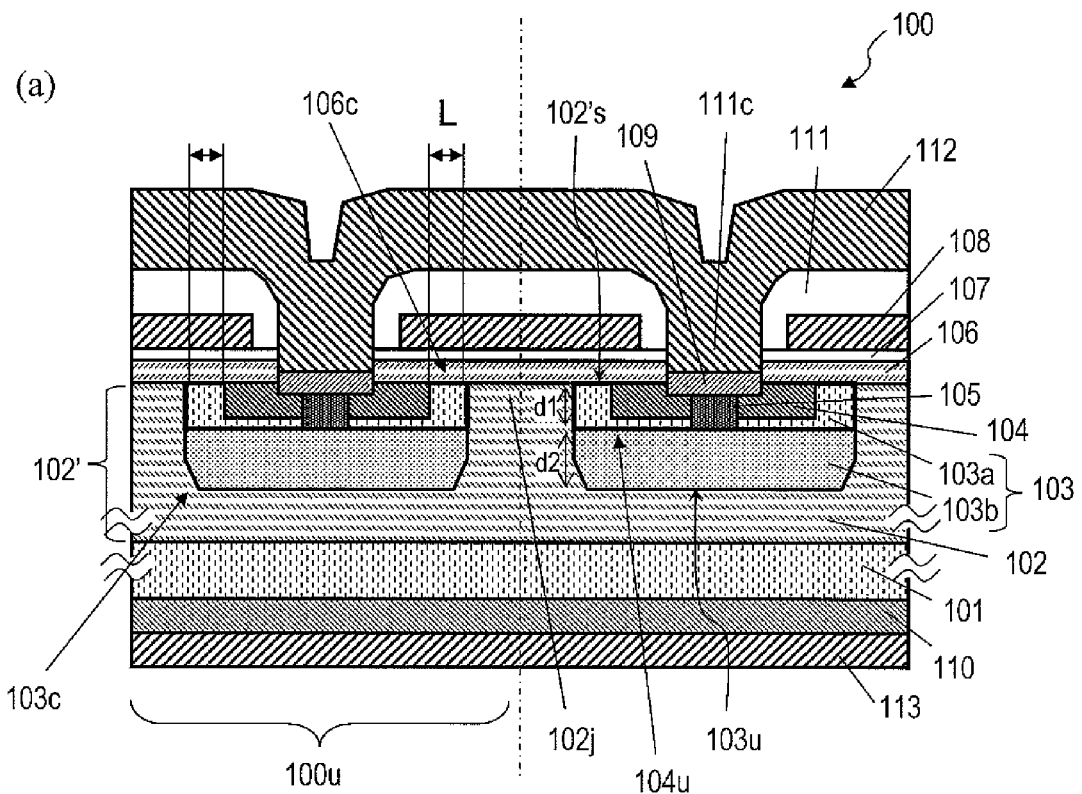
FIG. 1 (a) is a cross-sectional view illustrating a first embodiment of a semiconductor element according to the present invention and (b) and (c) are schematic representations illustrating the arrangement of unit cells.
Figure 1:
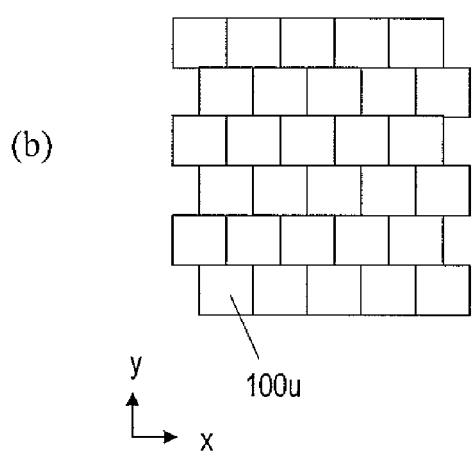
Figure 1:
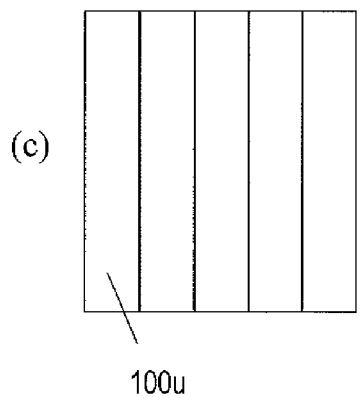

Hereinafter, a first embodiment of a semiconductor element according to the present invention will be described with reference to the accompanying drawings. FIG. 1(a) schematically illustrates a cross section of a semiconductor element 100 as a first embodiment of the present invention. In FIG. 1(a), a cross section of two semiconductor elements, which are respectively located on the right- and left-hand sides of the one-dot chain, is illustrated. These two semiconductor elements form a unit cell 100u. Any retailed semiconductor device has a number of such unit cells.

The semiconductor element 100 includes a semiconductor substrate 101 of a first conductivity type and a first silicon carbide semiconductor layer 102' of the first conductivity type, which has been formed on the principal surface of the semiconductor substrate 101. In this embodiment, the first conductivity type is n type and the second conductivity type is p type. But the first and second conductivity types may also be p and n types, respectively. The semiconductor substrate 101 has $n^+$ conductivity and is made of silicon carbide. The first silicon carbide semiconductor layer 102' is of $n^-$ type. It should be noted that the superscript "+" or "−" added to the conductivity type "n" or "p" represents the relative concentration of the dopant introduced. That is to say, "$n^+$" means that the concentration of an n-type dopant added is higher than "n", while "$n^-$" means that the concentration of an n-type dopant added is lower than "n".

In the first silicon carbide semiconductor layer 102', defined is a body region 103 of the second conductivity type. The rest of the first silicon carbide semiconductor layer 102' other than the body region 103 will be referred to herein as a "drift region 102".

The body region 103 includes a first body region 103a of the first conductivity type and a second body region 103b of the second conductivity type. The first body region 103a is in contact with the surface 102's of the first silicon carbide semiconductor layer and the second body region 103b is in contact with the bottom 103u of the body region 103. As measured perpendicularly to the principal surface of the semiconductor substrate 101, the first and second body regions 103a and 103b have thicknesses of at least 15 nm and at least 100 nm, respectively. In this embodiment, the first body region 103a is of $p^+$ type and the second body region 103b is of p-type. As will be described in detail later, it is beneficial if the average impurity concentration of the first body region 103a is twice or more as high as that of the second body region 103b.

The body region 103 is formed by introducing a dopant of the second conductivity type into the first silicon carbide semiconductor layer 102' of the first conductivity type. That is why the body region 103 includes both a dopant of the first conductivity type and the dopant of the second conductivity type and is defined to be a region in which the concentration of the dopant of the second conductivity type is higher than that of the dopant of the first conductivity type. At the bottom 103u of the body region 103, the concentration of the dopant of the first conductivity type in the drift region 102 (i.e., part of the first silicon carbide semiconductor layer 102') that contacts with the body region 103 is as high as that of the dopant of the second conductivity type in the second body region 103b. Also, when viewed perpendicularly to the principal surface of the semiconductor substrate 101, the contours of the first and second body regions 103a and 103b match with each other.

An impurity region 104 of the first conductivity type is provided in the body region 103. More specifically, the impurity region 104 is arranged in the first body region 103a so as to contact with the surface 102' of the first silicon carbide semiconductor layer 102'. The bottom of the first body region 103a had better be located deeper than the bottom 104u of the impurity region 104. The impurity region 104 is of n$^+$ type and is defined to function as a region of the first conductivity type. That is why the bottom 104u of the impurity region 104 is located at the boundary between the region functioning as the region of the first conductivity type and the region functioning as the body region 103.

A contact region 105 of the second conductivity type had better be provided in the first body region 103a and may be of p$^+$ type. The contact region 105 contacts with the second body region 103b. A first ohmic electrode 109 has been formed over the impurity region 104. The first ohmic electrode 109 covers the respective surfaces of, and is electrically in contact with, both of the impurity region 104 and the contact region 105. If the first body region 103a has a sufficiently high impurity concentration, then the contact region 105 may be omitted. In that case, a contact trench may be cut so as to expose the first body region 103a and be filled with the first ohmic electrode 109, thereby making the first body region 103a and the first ohmic electrode 109 contact directly with each other.

A portion 102j of the drift region 102 which is adjacent to the body region 103 (i.e., the region 102j interposed between the respective body regions 103 of two adjacent unit cells) will be referred to herein as a JFET (junction field-effect transistor) region for the sake of simplicity of description. As this region forms part of the first silicon carbide semiconductor layer 102', its impurity concentration may be the same as that of the first silicon carbide semiconductor layer 102'. However, in order to reduce the resistance in the JFET region 102j, a dopant of the first conductivity type (which is n-type in this example) may be introduced into that region by ion implantation, for example, and the region 102j may have a higher impurity concentration than the first silicon carbide semiconductor layer 102'.

On the first silicon carbide semiconductor layer 102', arranged is a second silicon carbide semiconductor layer 106 of the first conductivity type, which partially in contact with the body region 103 and the impurity region 104. It will be more beneficial if in the impurity region 104 and the first silicon carbide semiconductor layer 102', the second silicon carbide semiconductor layer 106 is electrically connected to the JFET region 102j that is adjacent to the first body region 103a and is located over the first body region 103a.

In this embodiment, the second silicon carbide semiconductor layer 106 has been grown epitaxially. The second silicon carbide semiconductor layer 106 has a channel region 106c in its portion that contacts with the first body region 103a. The length of the channel region 106c (which will be referred to herein as a "channel length L") is as indicated by each of the two double-headed arrows shown in FIG. 1(a). That is to say, the "channel length" of the MISFET is defined by a horizontal size measured on the upper surface of the first body region 30a (i.e., the surface that contacts with the second silicon carbide semiconductor layer 106) on the paper.

A gate insulating film 107 has been formed on the second silicon carbide semiconductor layer 106. A gate electrode 108 is arranged on the gate insulating film 107. The gate electrode 108 is located over the channel region 106c to say the least.

An interlevel dielectric film 111 has been deposited over the gate electrode 108, and an upper interconnect electrode 112 is stacked on the interlevel dielectric film 111. The upper interconnect electrode 112 is connected to the first ohmic electrode 109 through a contact hole 111c that has been cut through the interlevel dielectric film 111. On the back surface of the semiconductor substrate 101, arranged is a second ohmic electrode 110. And a back surface interconnect electrode 113 is further stacked on the second ohmic electrode 110.

When the semiconductor element 100 is viewed from over the upper interconnect electrode 112, each unit cell 100u of the semiconductor element 100 may have a square shape, for example. Alternatively, the unit cell 100u may also have a rectangular shape, a quadrilateral shape or any other polygonal shape as well. FIG. 1(b) illustrates an arrangement of unit cells 100u. As shown in FIG. 1(b), the unit cells 100u are arranged two-dimensionally in x and y directions, and rows of unit cells shift alternately by a half pitch in the y direction. If the unit cells 100u have a shape that is elongated in one direction, then the unit cells 100u may also be arranged in parallel as shown in FIG. 1(c). A semiconductor device is formed by a number of unit cells 100c that are arranged in this manner.

Next, it will be described how this semiconductor element 100 operates. In the semiconductor element 100, the second silicon carbide semiconductor layer 106, the gate electrode 108 that controls the amount of current flowing through the second silicon carbide semiconductor layer 106, the gate electrode 108, the gate insulating film 107, the second silicon carbide semiconductor layer 106, and the first and second ohmic electrodes 109 and 110 that are electrically connected to the second silicon carbide semiconductor layer 106 together form a MISFET. Supposing the threshold voltage of the MISFET (i.e., the threshold voltage of the forward current) is Vth, the MISFET turns ON if Vgs≥Vth is satisfied. On the other hand, if Vds>0 V is satisfied, current flows from the second ohmic electrode 110 toward the first ohmic electrode 109 through the second silicon carbide semiconductor layer 106. On the other hand, if Vgs<Vth is satisfied, the transistor turns OFF.

If 0≤Vgs<Vth and Vds<0 V are satisfied, this MISFET can function, even in OFF state, as a diode that makes current flow from the first ohmic electrode 109 toward the second ohmic electrode 110 through the second silicon carbide semiconductor layer 106 by appropriately setting the respective impurity concentrations of the first body region 103a and the second silicon carbide semiconductor layer 106 and the thickness of the second silicon carbide semiconductor layer 106. In this description, such a diode that makes current flow from the first ohmic electrode 109 toward the second ohmic electrode 110 through the second silicon carbide semiconductor layer 106 will be referred to herein as a "channel diode". Since the direction of current flowing from the second ohmic electrode 110 toward the first ohmic electrode 109 is defined herein to be the "forward direction" and the direction of current flowing from the first ohmic electrode 109 to the second ohmic electrode 110 is defined herein to be the "reverse direction", it is in the "reverse direction" that this diode makes current flow.

This channel diode that uses the channel region of the MISFET as a current path has such a characteristic that does not make a current of 1 mA or more flow if Vds>Vf0 (where Vf0 is a negative value) is satisfied but does make a current of 1 mA or more flow if Vds≤Vf0 is satisfied. In other words, the current that flows through this diode is almost zero (i.e., less than 1 mA) if Vds>Vf0 (where Vf0 is a negative value) is satisfied. However, as Vds is gradually decreased from zero (i.e., as the absolute value of Vds is gradually increased), Vds will soon get equal to Vf0, when this diode will start to make a current of 1 mA flow. And as the absolute value of Vds is further increased, the amount of the current flowing will further increase. In this sense, Vf0 corresponds to the "turn-on voltage" as defined in the current-voltage characteristic of a diode.

Both the turn-on voltage Vf0 of the diode and the threshold voltage Vth of the transistor are determined mainly by the impurity concentration of the first body region 103a, the impurity concentration and thickness of the second silicon carbide semiconductor layer 106 and the thickness of the gate insulating film 107.

Figure 2:
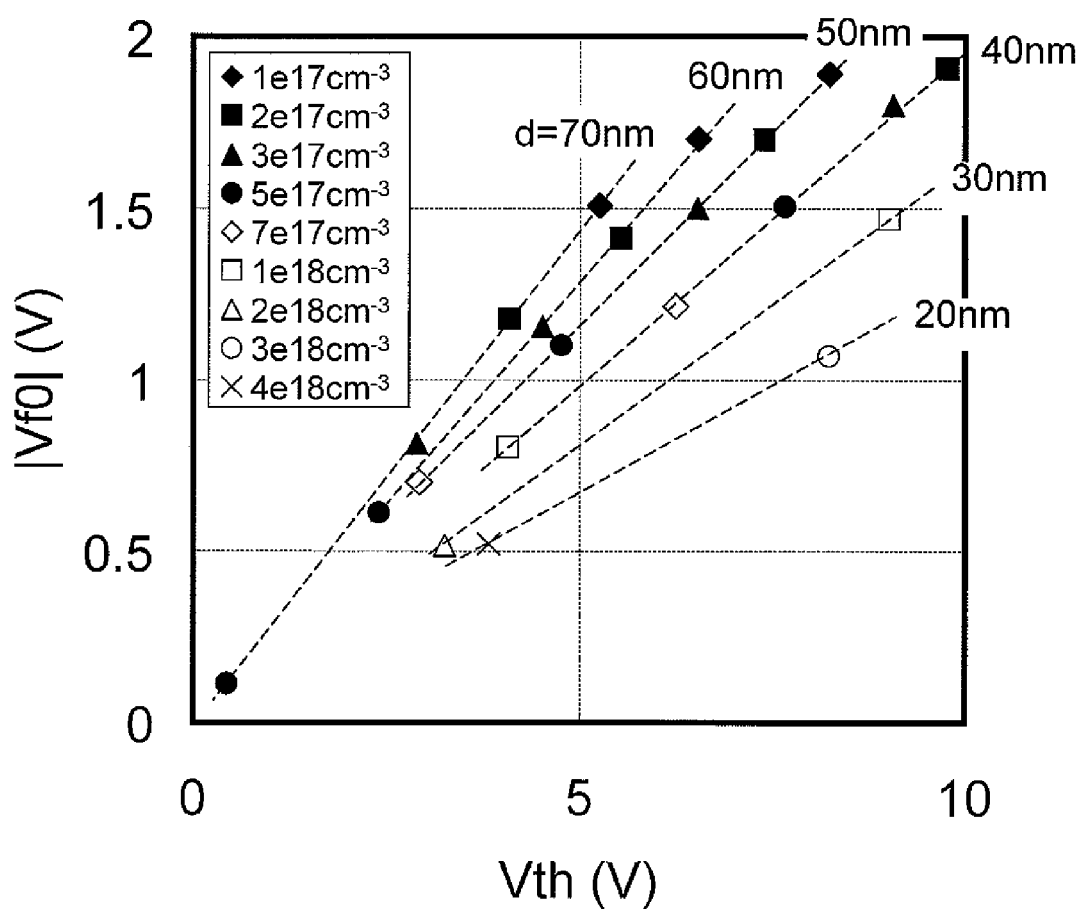
FIG. 2 A graph showing how the threshold voltage Vth of the semiconductor element 100 shown in FIG. 1 and the turn-on voltage |Vf0| of the channel diode change with the impurity concentration and thickness of the second silicon carbide semiconductor layer 106 in the semiconductor element 100.

The semiconductor element 100 of this embodiment can control Vth and Vf0 independently of each other. FIG. 2 shows the results of simulations indicating how the threshold voltage Vth of the transistor and the absolute value of the turn-on voltage of the channel diode |Vf0| change with the impurity concentration and thickness of the second silicon carbide semiconductor layer 106 in a situation where the thickness of the gate insulating film 107 is set to be 70 nm and the impurity concentration of the first body region 103a is set to be $1 \times 10^{19}$ cm$^{-3}$ as an example. As can be seen from FIG. 2, in a situation where the absolute value |Vf0| of the turn-on voltage Vf0 of the channel diode should be about 1 V, if the impurity concentration and thickness of the second silicon carbide semiconductor layer 106 are set to be approximately $2.5 \times 10^{17}$ cm$^{-3}$ approximately 70 nm, respectively, then the semiconductor element 100 has a Vth of about 3.5 V. On the other hand, if the impurity concentration and thickness of the second silicon carbide semiconductor layer 106 are set to be approximately $1.5 \times 10^{18}$ cm$^{-3}$ and approximately 30 nm, respectively, then Vth of the semiconductor element 100 can be set to be approximately 6 V with a |Vf0| of approximately 1 V maintained.

The semiconductor element 100 of this embodiment can raise both the impurity concentration in the surface region of the body region 103 (i.e., in the first body region 103a) and the impurity concentration in the second silicon carbide semiconductor layer 106. As a result, the absolute value of Vf0 can be smaller than the absolute value of Vf at which current starts to flow through the body diode that is formed by the drift region 102 and the second body region 103b. And when the MISFET is in OFF state and when 0 V≤Vgs<Vth and Vds<0 V are satisfied, current can flow through the channel diode before starting to flow through the body diode.

On the other hand, the breakdown voltage of the semiconductor element 100 is determined by the pn junction that is formed by the second body region 103b and the drift region 102 (i.e., the first silicon carbide semiconductor layer 102').

In a situation where the second body region 103b has a high impurity concentration, if a bias voltage that is positive with respect to the first ohmic electrode 109 is applied to the second ohmic electrode 110, a voltage in the reverse direction will be applied to the pn junction that is formed by the second body region 103b and the drift region 102. As a result, the intensity of the electric field becomes locally high at their interface. In this case, the higher the concentration of the second body region 103b, the more likely the electric field intensity gets locally high. Among other things, the intensity of the electric field easily gets particularly high at a corner 103c of the body region 103 as shown in FIG. 1(a), thus determining the breakdown voltage of the semiconductor element 100. That is to say, the lower the concentration of the p-type dopant at the corner 103c, the higher the breakdown voltage of the semiconductor element 100 can be kept. Conversely, the higher the concentration of the dopant there, the lower the breakdown voltage gets. On top of that, the dopant in the body region 103 has been mostly introduced there by implanting ions of the dopant into silicon carbide and those ions of the dopant that have been implanted into the silicon carbide cannot be activated so perfectly as in the Si semiconductor. That is why the higher the impurity concentration in the body region 103, the more significant the influence of implant damage that has not quite been repaired in the body region 103 and the more likely leakage current will be generated. For that reason, the concentration in the second body region 103b had better be somewhat low.

In the semiconductor element 100 of this embodiment, the body region 103 is split into the first and second body regions 103a and 103b and the impurity concentrations of these regions can be controlled independently of each other. That is to say, on the one hand, the turn-on voltage Vf0 of the diode can be controlled by adjusting the impurity concentration of the first body region 103a. On the other hand, the breakdown voltage of the semiconductor element 100 can be controlled by adjusting the impurity concentration of the second body region 103b. For example, the first body region 103a may have an average impurity concentration of $1 \times 10^{18}$ cm$^{-3}$ to $1 \times 10^{20}$ cm$^{-3}$ and the second body region 103b may have an average impurity concentration of $1 \times 10^{17}$ cm$^{-3}$ to $1 \times 10^{19}$ cm$^{-3}$. And the average impurity concentration of the first body region 103a had better be twice or more as high as that of the second body region 103b.

On top of that, in this semiconductor element 100, the second silicon carbide semiconductor layer 106 is arranged on the impurity region 104 and the JFET region 102j. In other words, the second silicon carbide semiconductor layer 106 is in contact with the upper surface of the drift region 102. That is why the amount of current to flow through the channel diode when a negative voltage is applied to the second ohmic electrode 110 (i.e., if the second ohmic electrode 110 is reverse biased) with respect to the first ohmic electrode 109 can be comparable to that of the ON-state current to flow through the transistor when a positive voltage is applied to the second ohmic electrode 110 (i.e., if the second ohmic electrode 110 is forward biased) with respect to the first ohmic electrode 109. Specifically, the amount of the former current can be at least one-fifth, and at most twice, as large as that of the rated ON-state current of the transistor. For example, if the ON state current of the transistor is 15 A (at Vds=1 V) when Vgs=15 V, the amount of the channel diode current to flow becomes approximately 15 A (at Vds=2 V) when Vgs=0 V. Consequently, even if the second ohmic electrode 110 is supplied with a negative voltage (i.e., reverse-biased) with respect to the first ohmic electrode 109, the amount of current flowing through the body diode that is formed between the second body region 103b and the drift region 102 can be reduced significantly (and even to zero). As a result, a lot of current can flow through the channel diode.

Consequently, in the semiconductor element 100 of this embodiment, the so-called "freewheeling diode" to be connected anti-parallel to a MISFET built in a normal inverter circuit can function as the channel diode of the semiconductor element 100. That is to say, the freewheeling diode can be built in the semiconductor element 100.

In addition, the absolute value of the turn-on voltage Vf0 of the channel diode can be smaller than that of the turn-on voltage of the body diode, and therefore, the power loss caused by the inverter circuit can be cut down. Furthermore, since the amount of current flowing through the body diode can be reduced considerably, the decline in the crystallinity of the semiconductor element 100 can be minimized and its high breakdown voltage characteristic can be maintained. Consequently, this semiconductor element 100 ensures high reliability.

Figure 3:
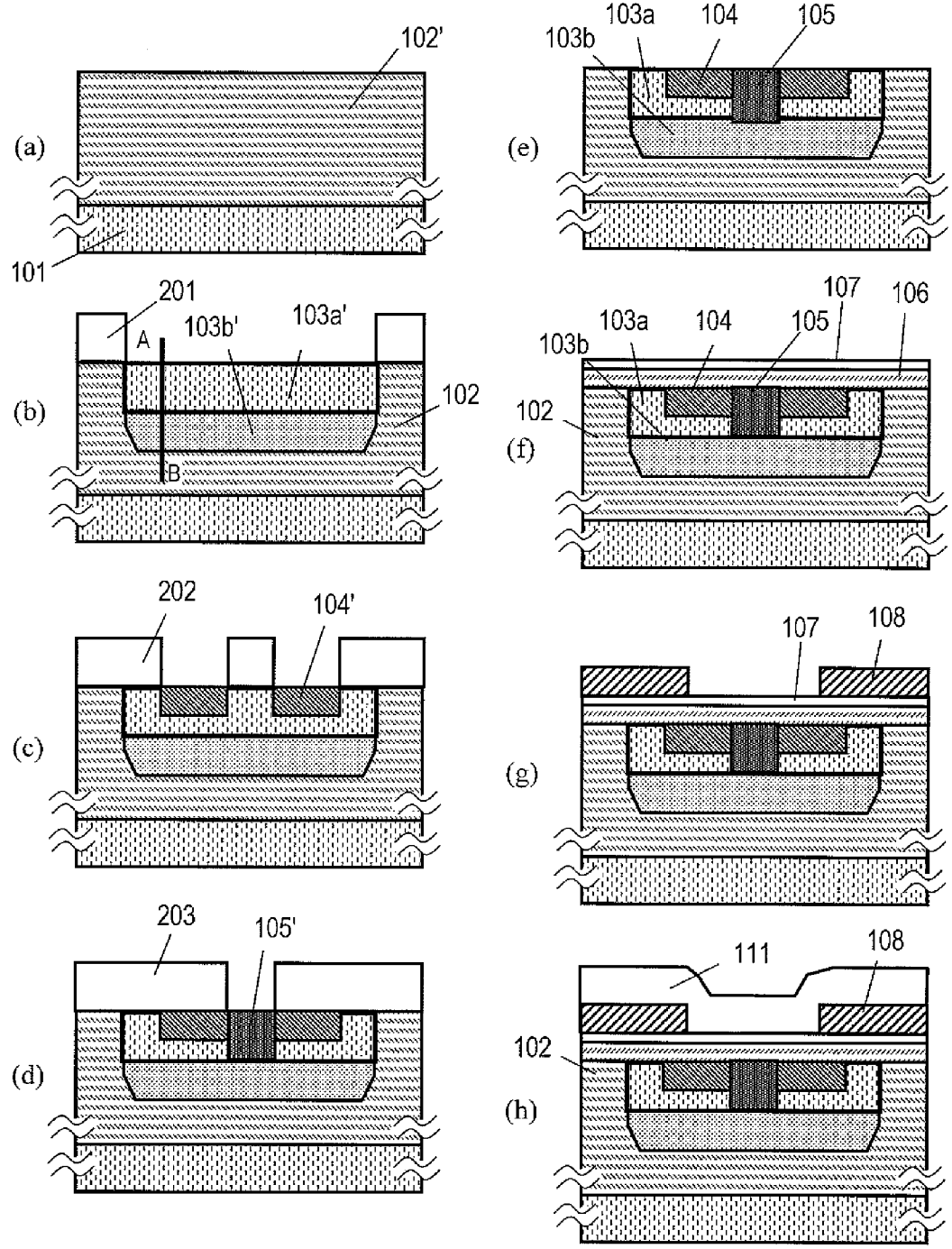
FIG. 3 (a) through (h) are cross-sectional views illustrating respective manufacturing process steps to fabricate the semiconductor element 100.
Figure 4:
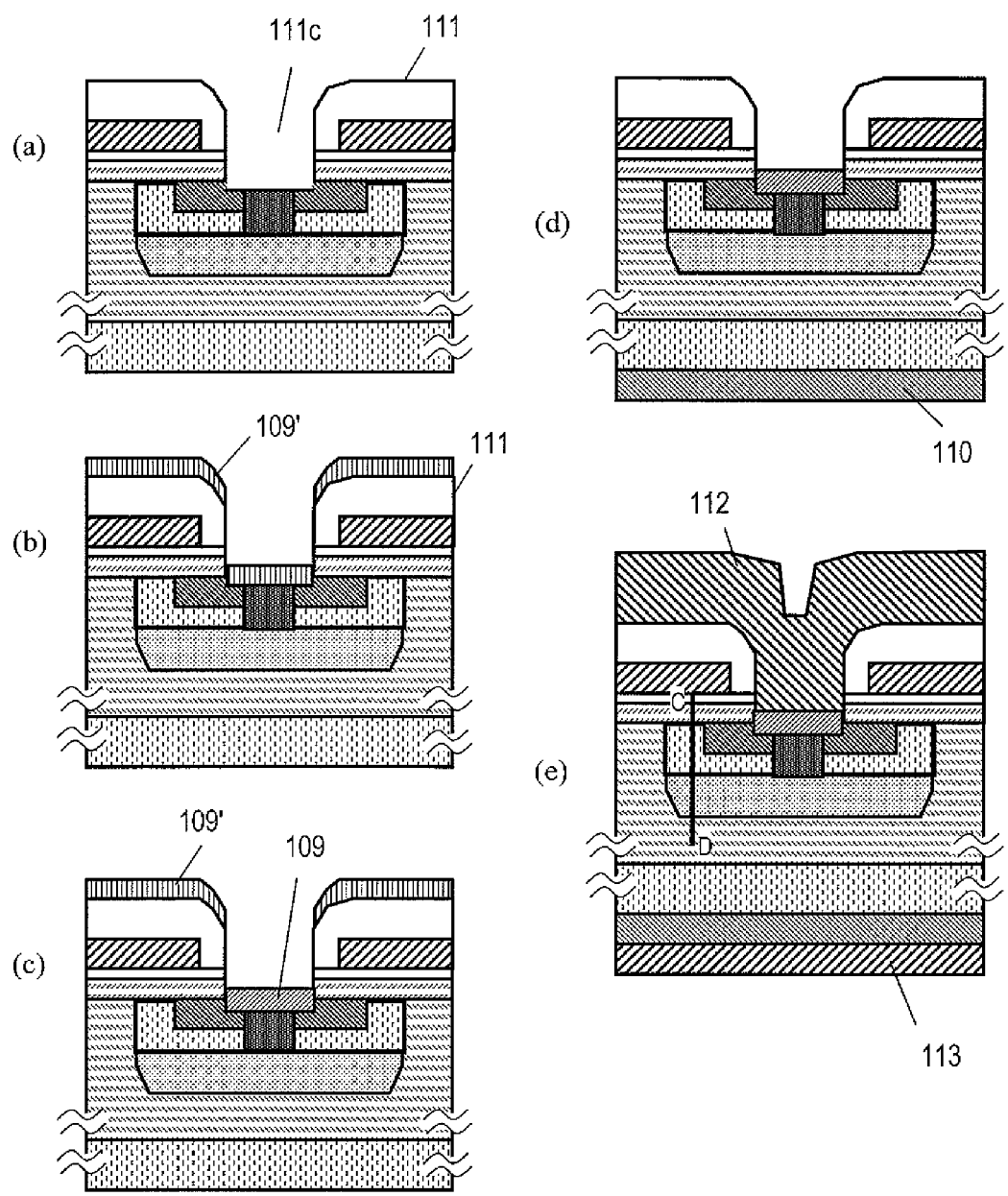
FIG. 4 (a) through (e) are cross-sectional views illustrating respective manufacturing process steps to fabricate the semiconductor element 100.

Hereinafter, it will be described with reference to FIGS. 3 through 5 how to fabricate the semiconductor element 100 of this embodiment. First of all, a semiconductor substrate 101 is provided. The semiconductor substrate 101 may be a low-resistance n-type 4H-SiC off-axis cut substrate (with a resistivity of 0.02 Ωcm), for example.

Next, as shown in FIG. 3(a), a first silicon carbide semiconductor layer 102' with high resistance is grown epitaxially on the semiconductor substrate 101. Before the first silicon carbide semiconductor layer 102' is formed, a buffer layer made of SiC with a high impurity concentration may be deposited on the semiconductor substrate 101. The buffer layer may have an impurity concentration of $1\times10^{18}$ cm$^{-3}$ and a thickness of 1 μm, for example. The first silicon carbide semiconductor layer 102' may be made of n-type 4H-SiC and may have an impurity concentration of $1\times10^{16}$ cm$^{-3}$ and a thickness of 10 μm, for example.

Thereafter, as shown in FIG. 3(b), the first silicon carbide semiconductor layer 102' is partially covered with a mask 201 of SiO$_2$, for example, through which ions of Al are implanted into the first silicon carbide semiconductor layer 102'. The ion-implanted region to be formed in this process step includes a first body implanted region 103a', which is a heavily doped shallow region, and a second body implanted region 103b', which is located deeper, and has been doped more lightly, than the first body implanted region 103a'.

When the ions implanted are activated, the first and second body implanted regions 103a' and 103b' will be first and second body regions 103a and 103b, respectively. Meanwhile, the rest of the first silicon carbide semiconductor layer 102', other than the first and second body regions 103a and 103b, will define a drift region 102.

Figure 5:
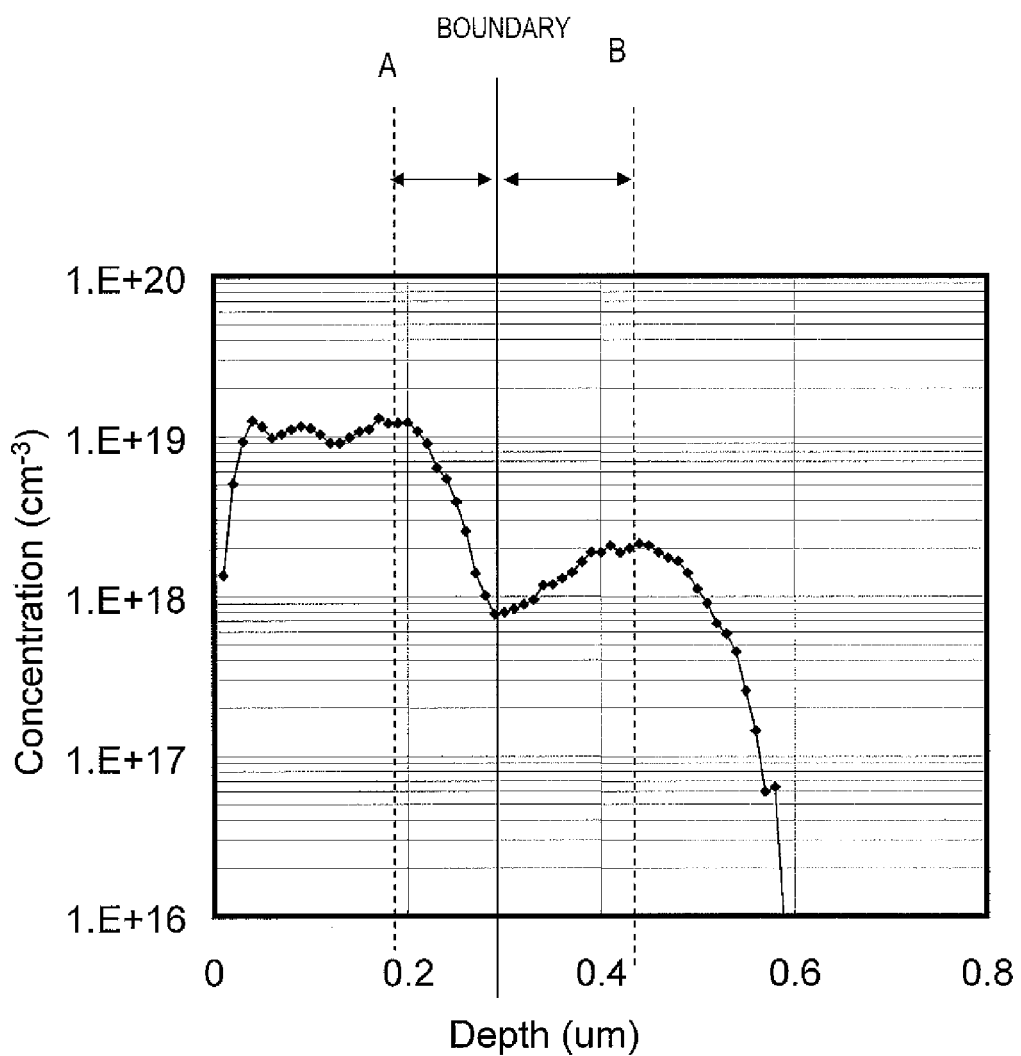
FIG. 5 Shows an exemplary ion implantation profile at the A-B cross section shown in FIG. 3(b).

FIG. 5 shows an exemplary ion implantation profile at the A-B cross section shown in FIG. 3(b). Strictly speaking, the impurity concentration is different from the ion implantation profile, and the impurity concentration is often lower than the ion implantation profile. This depends on the rate of activation of the dopant introduced. For example, if the rate of activation is 100%, the ion implantation profile becomes substantially identical with the impurity concentration. Supposing the rate of activation is α %, the dose of the ion implantation process may be multiplied by 1/(α/100) so that the impurity concentration intended can be achieved.

If Al is selected as an implant species as is done in this embodiment, Al has so small a diffusion coefficient in silicon carbide that a variation in concentration profile due to diffusion is almost negligible. On the other hand, if boron is used as a dopant to be introduced into the body region 103, then the rate of activation and the diffusion coefficient need to be obtained in advance and the ion implant energy and implant dose need to be set so as to obtain a desired impurity concentration profile. Eventually, the ion implantation profile at the A-B cross section is set so that the impurity concentration at the C-D cross section shown in FIG. 4(e) (to be described later) becomes an intended one. In the following description, the rate of activation is supposed to be 100%, the impurity concentration and the ion implantation profile are supposed to be substantially the same, and the impurity concentration profile of the body region 103 (consisting of the first and second body regions 103a and 103b) is supposed to be shown in FIG. 5.

The first and second body regions 103a and 103b are formed by ion implantation, and therefore, each have a peak and a tail. In this case, the "peak" refers herein to a local maximum value of the concentration in the ion implantation range Rp and the "tail" refers to a range where the concentration decreases from that local maximum value in the depth direction. For example, the ion implantation profile shown in FIG. 5 can be obtained by implanting Al ions with the following combinations of implant energies and doses:

30 keV: $3.0\times10^{13}$ cm$^{-2}$, 70 keV: $6.0\times10^{13}$ cm$^{-2}$, 150 keV: $1.5\times10^{14}$ cm$^{-2}$ and 350 keV: $4.0\times10^{13}$ cm$^{-2}$.

In that case, as indicated by the solid line in FIG. 5, the ranges that are shallower and deeper than a depth of 0.3 μm become the first and second body implanted regions 103a' and 103b', respectively, which will be the first and second body regions 103a and 103b when the dopant introduced there is activated. Supposing the rate of activation is 100% as described above, the impurity concentrations of the first and second body implanted regions 103a' and 103b' will be at most about $1\times10^{19}$ cm$^{-3}$ and about $2\times10^{18}$ cm$^{-3}$, respectively. If the rate of activation is 100%, then these values become the maximum impurity concentrations of the first and second body regions 103a and 103b. Also, their average impurity concentrations are about $9.7\times10^{18}$ cm$^{-3}$ and about $1.5\times10^{18}$ cm$^{-3}$, respectively. In the following description, the impurity concentration profile of the first and second body regions 103a and 103b is supposed to be shown in FIG. 5. Furthermore, the thicknesses (or depths) of the first and second body regions 103a and 103b are 300 nm as measured perpendicularly to the principal surface of the semiconductor substrate 101 (i.e., in the thickness direction of the first silicon carbide semiconductor layer 102').

In this description, the "average impurity concentration" is defined herein to be the average in portions where the impurity concentrations are equal to or higher than $2\times10^{18}$ cm$^{-3}$ or more as for the first body region 103a. As for the second body region 103b, on the other hand, the "average impurity concentration" is defined herein to be the average in portions where the impurity concentrations are equal to or higher than $5\times10^{17}$ cm$^{-3}$ or more. Although their average impurity concentrations are definitely defined to be $2\times10^{18}$ cm$^{-3}$ or more and $5\times10^{17}$ cm$^{-3}$ or more, these values could be changed depending on the type of the device to design. In that case, the average impurity concentration of the first body region 103a had better be at least twice, and at most 100 times, as high as the average impurity concentration of the second body region 103b. In this embodiment, $2\times10^{18}$ cm$^{-3}$ or more and $5\times10^{17}$ cm$^{-3}$ or more are based on the impurity concentration S in the vicinity of the boundary between the first and second body regions 103a and 103b. Specifically, S is defined to be $1\times10^{18}$ cm$^{-3}$ and the regions where the average impurity concentrations are calculated are defined to be a region where the impurity concentration is S×2 or more and a region where the impurity concentration is S/2 or more, respectively.

The thickness (depth) of the first body region 103a is determined by the turn-on voltage Vf0 of the channel diode, the concentration and thickness of the second silicon carbide semiconductor layer 106, and the thickness of the gate insulating film. When 0 V is applied to the gate electrode 108, the depletion layer that expands from the interface between the second silicon carbide semiconductor layer 106 and the first body region 103a toward the first body region 103a just needs to remain within the first body region 103a. For that purpose, considering the scope of the present invention, the thickness of the first body region 103a needs to be 15 nm or more. Meanwhile, the thickness of the second body region 103b needs to be 100 nm or more.

After the ions have been implanted, the mask 201 is removed. Then, ions of nitrogen, for example, are implanted into the first body implanted region 103a' through another mask 202, thereby defining a dopant implanted region 104' as shown in FIG. 3(c). Alternatively, the mask 201 could be left as it is and then covered with a sidewall mask to form the mask 202. That is to say, a so-called "self-aligning process" for self-aligning the dopant implanted region 104' with respect to the first body implanted region 103a' could be adopted as well.

Next, after the ions have been implanted, the mask 202 is removed. And still another mask 203 is provided and ions of Al are implanted through it, thereby defining a contact implanted region 105' as shown in FIG. 3(d). In this case, the contact implanted region 105' had better reach the second body implanted region 103b'.

After these ions have been implanted, the mask 203 is removed and an annealing process is carried out to activate those ions, thereby defining first and second body regions 103a and 103b, an impurity region 104 and a contact region 105 as shown in FIG. 3(e). The ion implantation profile is determined so that the first body region 103a has a depth of 300 nm, for example, and the average impurity concentration becomes approximately $1 \times 10^{19}$ cm$^{-3}$. Also, the ion implantation profile is adjusted so that the body region 103, which is comprised of the first and second body regions 103a and 103b in combination, has an overall depth of 550 nm, for example, and the second body region 103b has an average impurity concentration of about $2 \times 10^{18}$ cm$^{-3}$ and that the impurity region 104 has a depth of 250 nm, for example, and an average impurity concentration of about $5 \times 10^{19}$ cm$^{-3}$. In this case, the depth of the first body region 103a is determined by the boundary shown in FIG. 5 and the depth of the second body region 103b is supposed to be a depth at which an impurity concentration of $5 \times 10^{17}$ cm$^{-3}$ is achieved. On the other hand, the depth of the impurity region 104 is supposed to be a depth at which an impurity concentration of $5 \times 10^{17}$ cm$^{-3}$ is achieved.

The contact region 105 may have a depth of 400 nm and an average impurity concentration of about $1 \times 10^{20}$ cm$^{-3}$. And its depth is supposed to be a depth at which an impurity concentration of $5 \times 10^{17}$ cm$^{-3}$ is obtained. It should be noted that in order to clean the surface of the first silicon carbide semiconductor layer 102' that has been subjected to annealing for activation, a surface portion of the first silicon carbide semiconductor layer 102' is sometimes removed. For example, if a surface portion of the first silicon carbide semiconductor layer 102' has been removed to a depth of 50 nm, the respective depths of the first and second body regions 103a and 103b, the impurity region 104 and the contact region 105 will all decrease by about 50 nm to 250 nm, 200 nm, 200 nm and 350 nm, respectively.

Next, as shown in FIG. 3(f), a second silicon carbide semiconductor layer 106 is grown epitaxially over the entire surface of the drift region 102, including the first body region 103a, the impurity region 104 and the contact region 105. According to this embodiment, the impurity concentration N (cm$^{-3}$) and the thickness d (nm) of the second silicon carbide semiconductor layer 106 are adjusted so as to satisfy the following condition:

$N=2 \times 10^{18}$ $d=30$

Subsequently, a predetermined portion of the second silicon carbide semiconductor layer 106 is dry-etched away and then a gate insulating film 107 may be formed on the surface of the second silicon carbide semiconductor layer 106 by thermal oxidation, for example. If the gate insulating film 107 is formed by thermal oxidation, a portion of the second silicon carbide semiconductor layer 106 will form part of the gate insulating film 107. That is why the thickness of the second silicon carbide semiconductor layer 106 needs to be adjusted with the thickness to be lost through the thermal oxidation taken into account so that the second silicon carbide semiconductor layer 106 will have the thickness d after the gate insulating film 107 has been formed. In this example, the second silicon carbide semiconductor layer 106 may be deposited to a thickness that is approximately 50 nm greater than the thickness d and its thickness will decrease to that thickness d by going through the process step of cleaning the surface of the second silicon carbide semiconductor layer 106 before the gate insulating film is formed thereon and the process step of forming the gate insulating film. After that, a polysilicon film that has been doped with phosphorus to about $7 \times 10^{20}$ cm$^{-3}$ is deposited on the surface of the gate insulating film 107. The polysilicon film may have a thickness of about 500 nm.

Thereafter, as shown in FIG. 3(g), the polysilicon film is dry-etched using a mask (not shown), thereby forming a gate electrode 108 in an intended area. Then, as shown in FIG. 3(h), an interlevel dielectric film 111 of SiO$_2$, for example, is deposited to a thickness of 1.5 µm, for example, by CVD process over the respective surfaces of the gate electrode 108 and the first silicon carbide semiconductor layer 102'.

Next, as shown in FIG. 4(a), a portion of the interlevel dielectric film 111 is dry-etched away through a mask (not shown) from over the surface of the contact region 105 and the surface of a part of the impurity region 104, thereby cutting a contact hole 111c through it.

Subsequently, as shown in FIG. 4(b), a nickel film 109' is deposited to a thickness of about 50 nm on the interlevel dielectric film 111. Then, as shown in FIG. 4(c), a heat treatment is carried out at 950° C., for example, for five minutes within an inert atmosphere, thereby making the nickel film 109' react with the surface of silicon carbide and forming a first ohmic electrode 109 of nickel silicide. After that, as shown in FIG. 4(d), the nickel film 109' on the interlevel dielectric film 111 is etched away and then nickel, for example, is deposited over the entire back surface of the semiconductor substrate 101, too, and then made to react with silicon carbide through a heat treatment in the same way, thereby forming a second ohmic electrode 110 there.

Next, an aluminum film is deposited to a thickness of about 4 µm to cover the interlevel dielectric film 111 and to fill the contact hole 111c and then etched into a predetermined pattern, thereby obtaining an upper interconnect electrode 112 as shown in FIG. 4(e). Although not shown, a gate line (or gate pad) to contact with the gate electrode is also formed somewhere else at an end of the chip. Furthermore, Ti/Ni/Ag films for use to make die bonding may be deposited in this order on the back surface of the second ohmic electrode 110 to form a back surface interconnect electrode 113. In this case, the Ti film contacts with the second ohmic electrode 110. In this manner, the semiconductor element 100 shown in FIG. 1 can be obtained.

The semiconductor element 100 of the present invention includes first and second body regions with mutually different concentrations and can control independently of each other the second body region that affects the breakdown voltage of the element and the first body region that affects the threshold voltage Vth of the transistor and the turn-on voltage Vf0 of the channel diode. As a result, the channel diode can be used as a freewheeling diode and a highly reliable semiconductor element with a high breakdown voltage can be provided. In order to decrease the turn-on voltage |Vf0| of the channel diode (to 1 V or less to say the least, and to 0.6 V if possible) while keeping the breakdown voltage of the element high enough and to maintain a positive threshold voltage Vth (which had better fall within the range of 2 V through 8 V) for the transistor, it would be beneficial to set the average impurity concentration of the second body region to be lower than that of the first body region. If the turn-on voltage of the channel diode is set to be 1 V or less, the Schottky diode of SiC, which is a candidate for a freewheeling diode, can be replaced. And if the turn-on voltage of the channel diode is set to be 0.6 V or less, a fast recovery diode of Si can be replaced. That is to say, the semiconductor element 100 can also function as a freewheeling diode by itself, and therefore, there is no need to use any of these freewheeling diodes anymore. Furthermore, the threshold voltage Vth of the forward current had better be 2 V or more. A semiconductor element (which is typically a MISFET) to be ordinarily used in an inverter circuit that is a power circuit had better be normally OFF (i.e., Vth>0 V). This is because even if the gate controller went out or order and the gate voltage went 0 V for some reason, the drain current could still be shut off safely in that case. Also, the higher the temperature, the lower the threshold voltage of a MISFET tends to be. For example, in the case of an SiC-MOSFET, a rise in temperature of 100° C. could cause a decrease of approximately 1 V. In this case, supposing the noise margin is 1 V in order to prevent the gate from being turned ON accidentally due to noise, Vth at room temperature had better be set to be equal to or higher than 2 V (=1 V+1 V). Also, if the threshold voltage were too high, the gate voltage to be applied to turn the transistor ON would increase accordingly, and a lot of constraints would be imposed on the power supply to generate the gate voltage. For that reason, it is recommended to set the threshold voltage to be 8 V or less in practice.

On top of that, by setting the average impurity concentration of the second body region to be lower than that of the first body region, a process for making a structure that reduces an overconcentration of an electric field around the periphery of a semiconductor element can be designed more easily. Hereinafter, this respect will be described.

Figure 6:
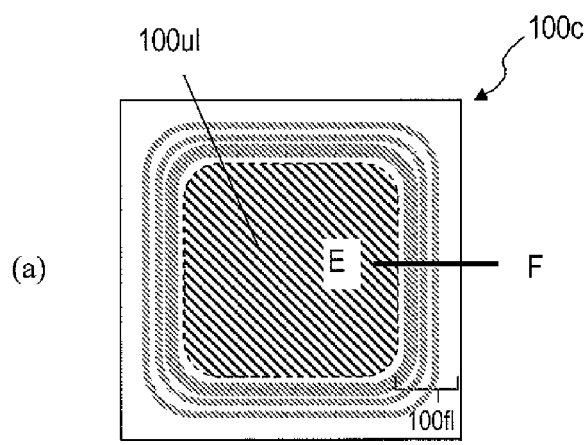
FIG. 6 (a) is a top view illustrating a semiconductor device, (b) is a cross-sectional view of a unit cell 100u thereof, and (c) is a cross-sectional view as viewed on the plane E-F shown in FIG. 6(a).
Figure 6:
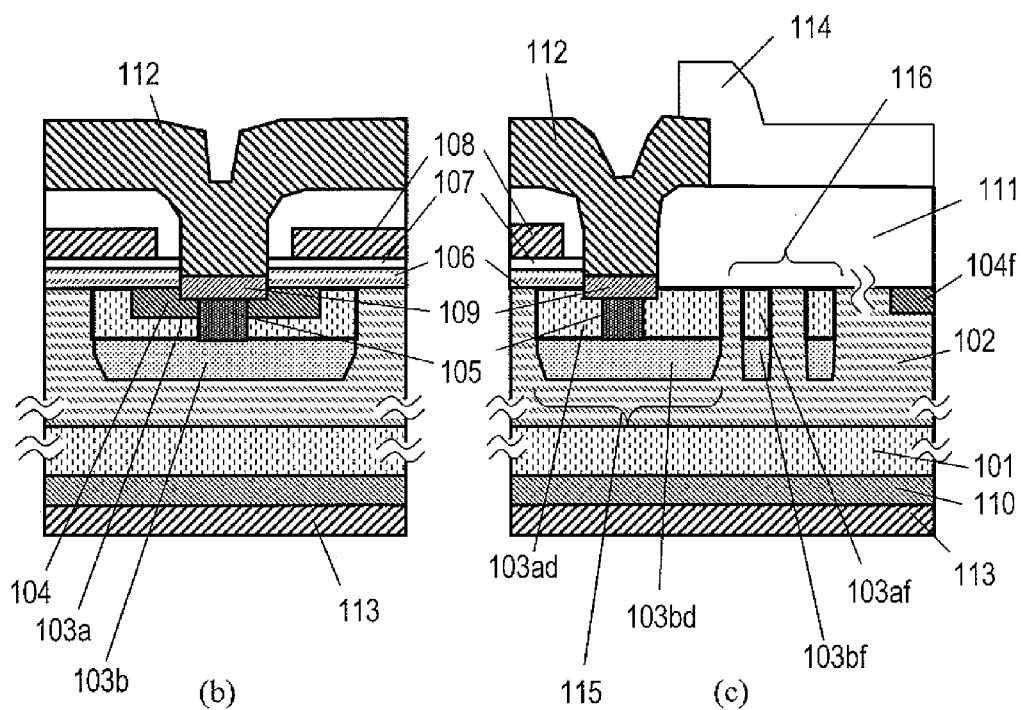

FIG. 6(a) is a schematic representation illustrating a part of a semiconductor device 100c, including a number of semiconductor elements 100 as unit cells, as viewed from over the upper interconnect electrode 112. As shown in FIG. 6(a), the semiconductor element 100 is often diced into a quadrilateral shape. The semiconductor device 100c includes a unit cell arrangement portion 100u1 and a peripheral portion 100f1. In the unit cell arrangement portion 100u1, arranged is the unit cell shown in FIGS. 1(b) and 1(c). The peripheral portion 100f1 is arranged so as to surround the unit cell arrangement portion 100u1. FIG. 6(b) shows the unit cell 100u of the semiconductor element 100 that is already shown in FIG. 1(a). FIG. 6(c) is a cross-sectional view of the device as viewed on the plane E-F shown in FIG. 6(a). The semiconductor device includes an implanted region 115 of the second conductivity type, which is arranged in the peripheral portion 100f1. The implanted region 115 is arranged mostly on the outermost periphery of the unit cell 100u and is defined by the same planar shape as the unit cell 100u (e.g., the square shape shown in FIG. 1(b)). The semiconductor device further includes a ring region (FLR) 116 of the second conductivity type. On a plane that is parallel to the principal surface of the semiconductor substrate 101, the ring region 116 surrounds the unit cell arrangement portion 100u1 and the implanted region 115 as a ring and may be made up of either a single ring or multiple rings. A depletion suppressing region 104f of the first conductivity type is further arranged outside of the ring region 116 and surrounds the ring region 116. The implanted region 115 and the ring region 116 play the role of reducing the overconcentration of an electric field at one end of the element by affecting the breakdown voltage of the element.

In order to reduce the overconcentration of the electric field at the periphery of the element, it is effective to provide the implanted region 115 and the ring region 116, of which the conductivity type (i.e., p-type in this example) is opposite to that of the drift region 102 that is provided to have a predetermined breakdown voltage. By forming the implanted region 115 and the ring region 116 while the body region 103 is being formed in the semiconductor element 100, the manufacturing process of the semiconductor device can be simplified and the process cost can be cut down as well. In FIG. 6(c), for example, in the process step of forming the first and second body implanted regions 103a' and 103b' shown in FIG. 3(b) during the manufacturing process of the semiconductor element 100, the implanted region 115 and the ring region 166 may also be formed at the same time. That is to say, the first and second regions 103ad and 103bd of the implanted region 115 may have the same impurity concentration profiles as the first and second body regions 103a and 103b, respectively. So are the impurity concentration profiles of the first and second ring region 103af and 103bf of the ring region 116.

If the process design is facilitated by forming the first and second body regions in the unit cell arrangement portion 100u1 and the implanted region 115 and the ring region 116 in the peripheral portion 100f1 at the same time, the decrease in the breakdown voltage of the element can also be checked effectively. And in order to minimize the decrease in the breakdown voltage of the element, the overconcentration of an electric field at the peripheral portion 100f1 needs to be reduced in one way or another. In this case, to reduce the overconcentration of the electric field successfully, it is important how to design the implanted region 115 and the ring region 116 of the element. For that purpose, the best width, interval, and number of the rings included in the ring region 116 and the best impurity concentration in the second ring region 103bf may be determined first, and based on that element design, a set of masks to carry out the semiconductor process is prepared. Since an electric field gets overly concentrated at a pn junction in most cases, the intensity of the electric field will often become excessively high at the respective bottoms of the second region 103bd and the second ring region 103bf in the peripheral portion 100f1. In the semiconductor element 100 of the present invention, the implanted region 115 and the ring region 116 of the peripheral portion 100f1 can be formed at the same time with the first and second body regions 103a and 103b in the unit cell arrangement portion 100u1. In that case, while fixing the impurity concentrations of the second body region 103b, the second region 103bd and second ring region 103bf that will affect the breakdown voltage of the element on the one hand and determining arbitrarily the impurity concentration of the first body region 103a through the process, the intended Vth and |Vf0| can be obtained with the decrease in the breakdown voltage of the element minimized. That is to say, even if the impurity concentration of the body region is changed, there is no need to modify the element design process (i.e., to remake masks). Instead, the flexibility of the process design can be increased without modifying the element design process.

Embodiment 2

Figure 7:
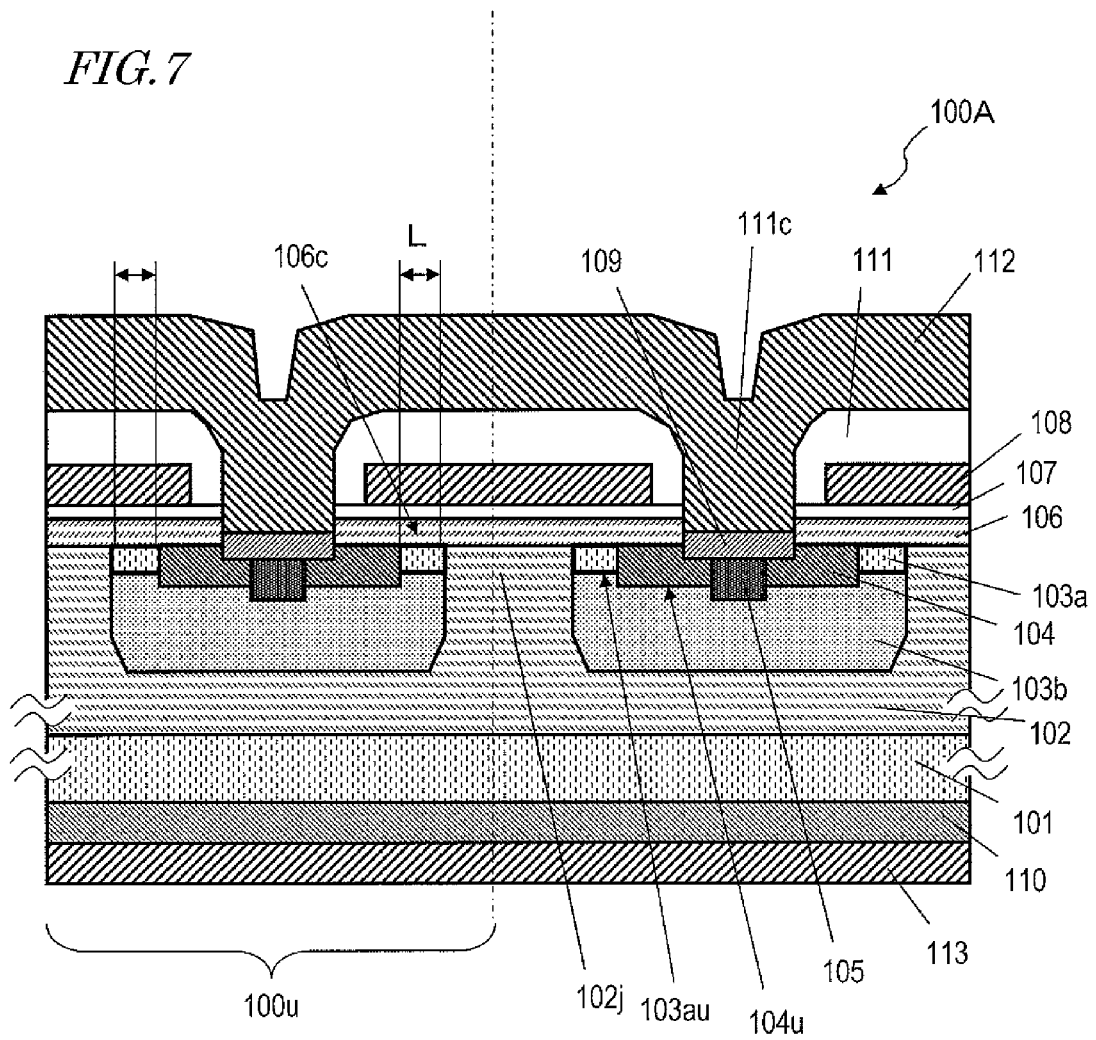
FIG. 7 A cross-sectional view illustrating a second embodiment of a semiconductor element according to the present invention.
Figure 8:
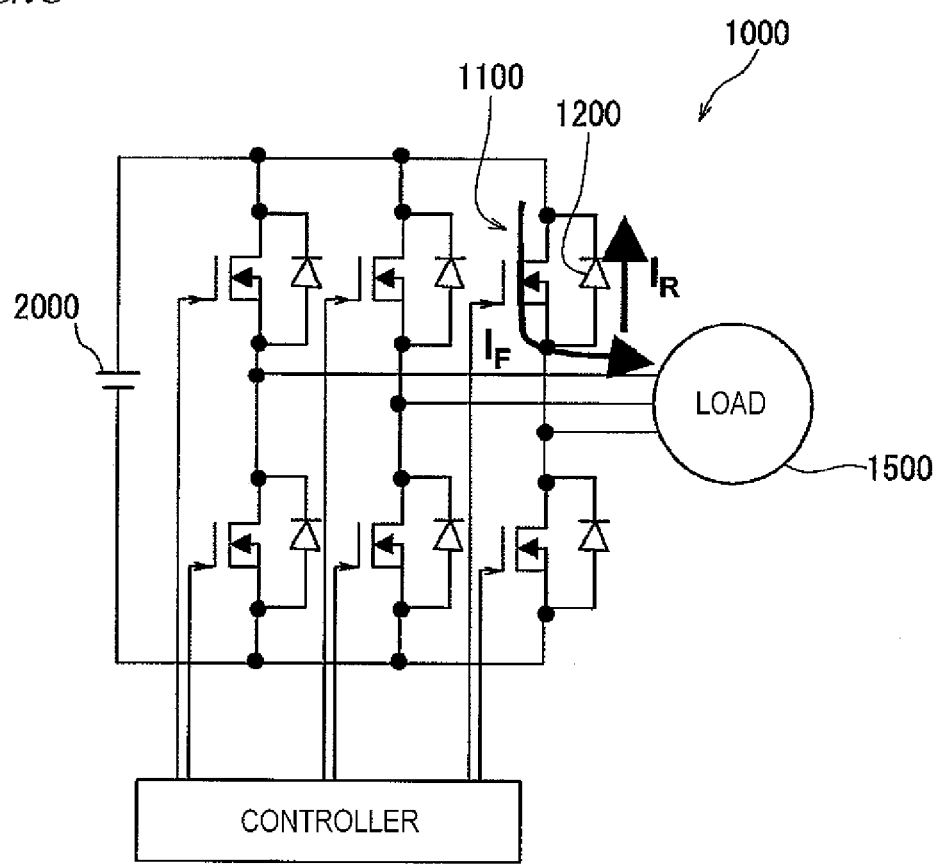
FIG. 8 A circuit diagram illustrating a typical configuration for an inverter circuit 1000.
Figure 9:
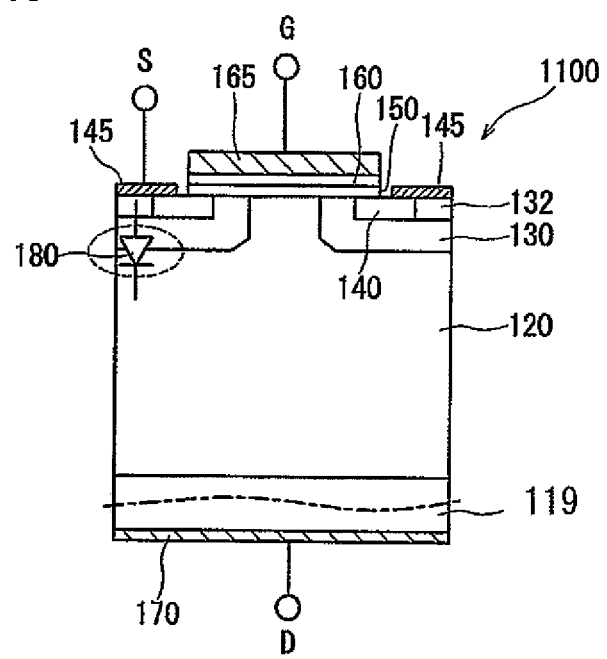
FIG. 9 A cross-sectional view illustrating a semiconductor element (SiC-MISFET) 1100.
Figure 10:
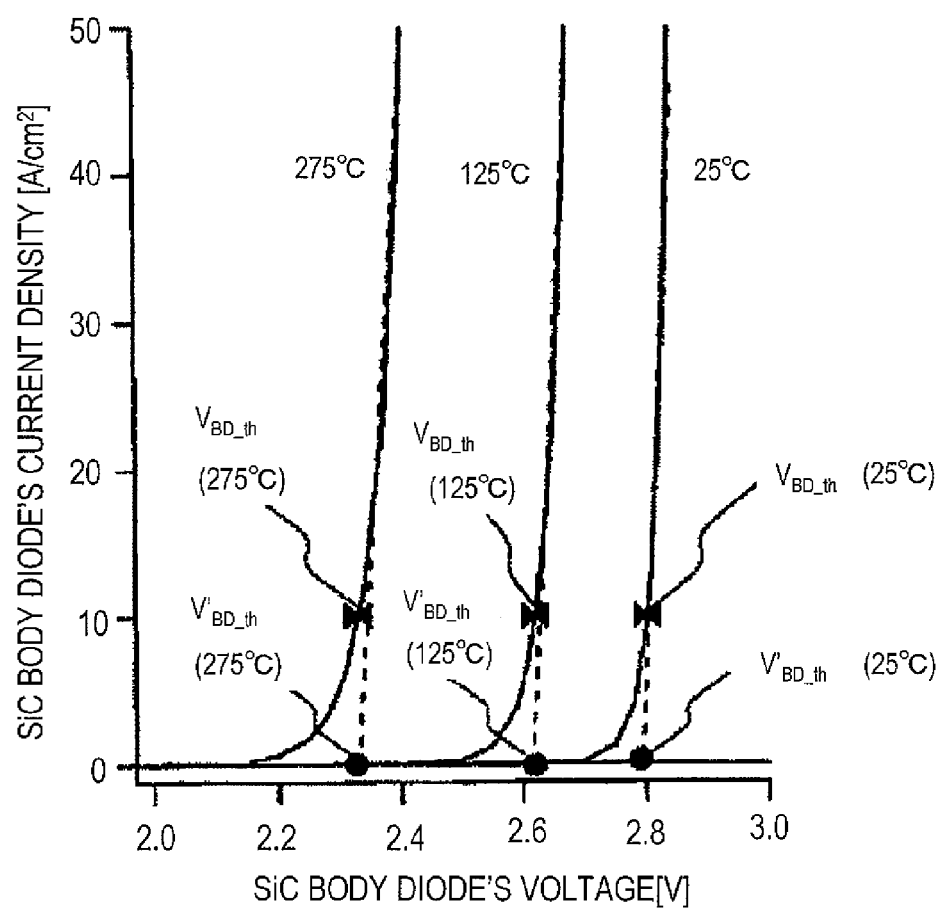
FIG. 10 A graph showing turn-on voltages of a SiC body diode.
Figure 11:
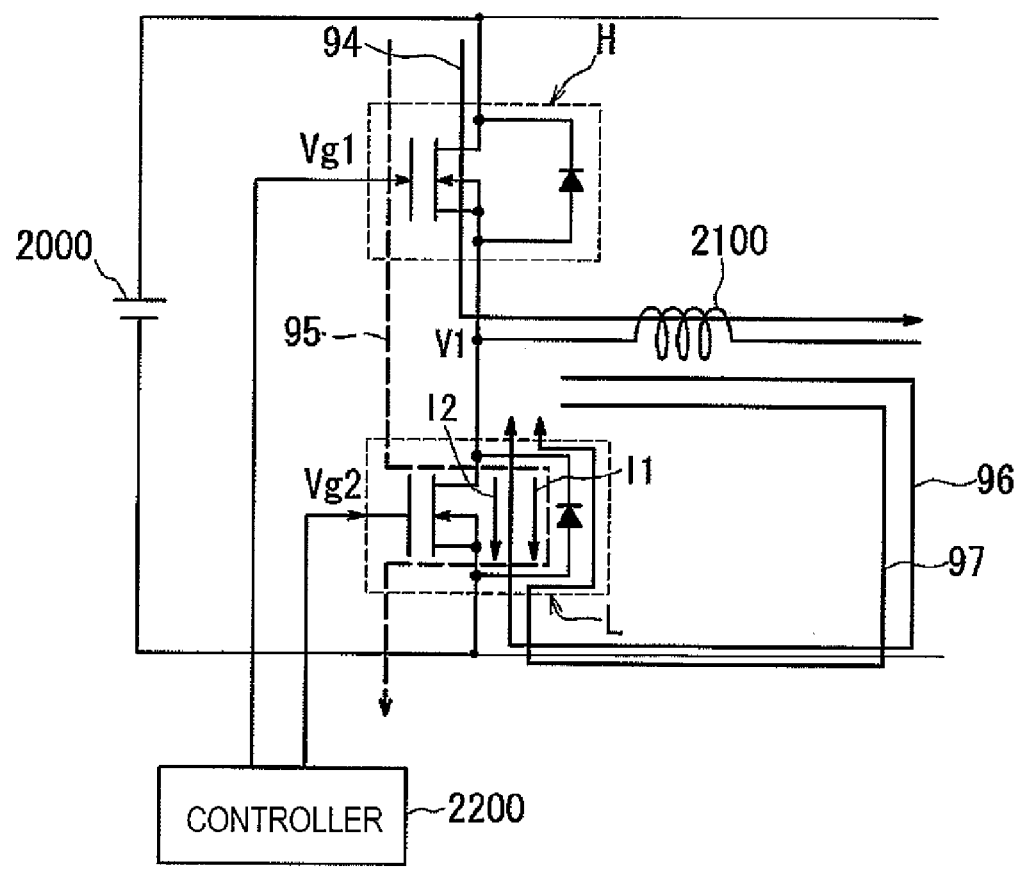
FIG. 11 A circuit diagram illustrating a one-phase portion of the three-phase inverter of the inverter circuit shown in FIG. 8.
Figure 12:
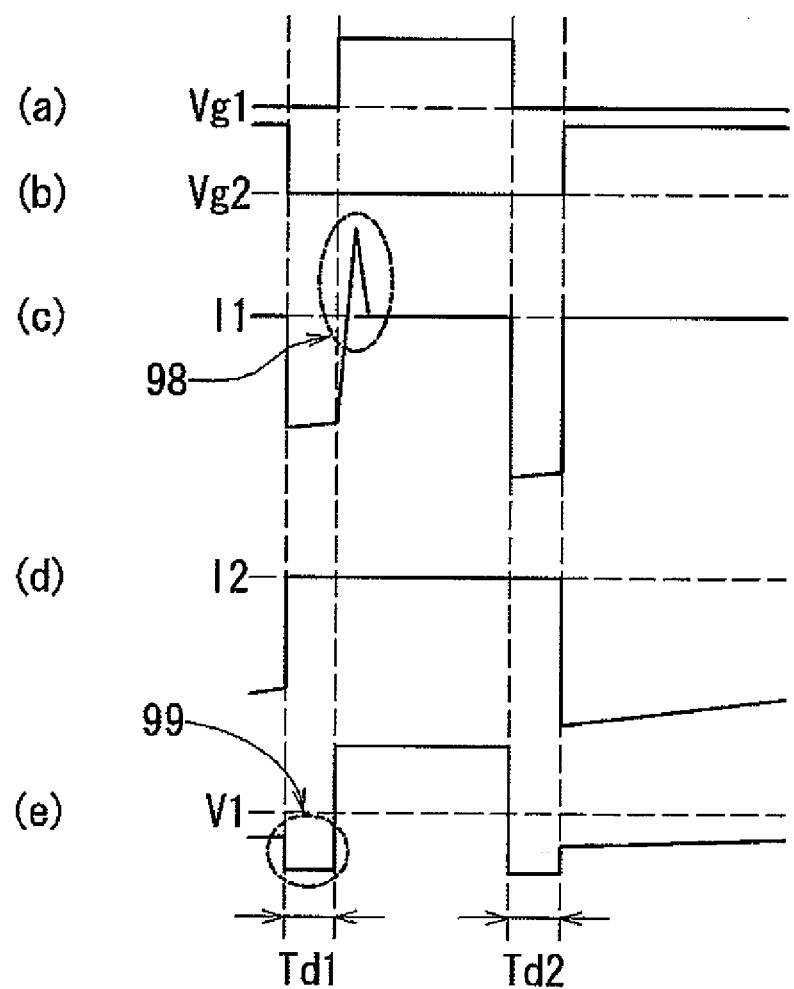
FIG. 12 A timing diagram showing the operating waveforms of the circuit shown in FIG. 11.
Figure 13:
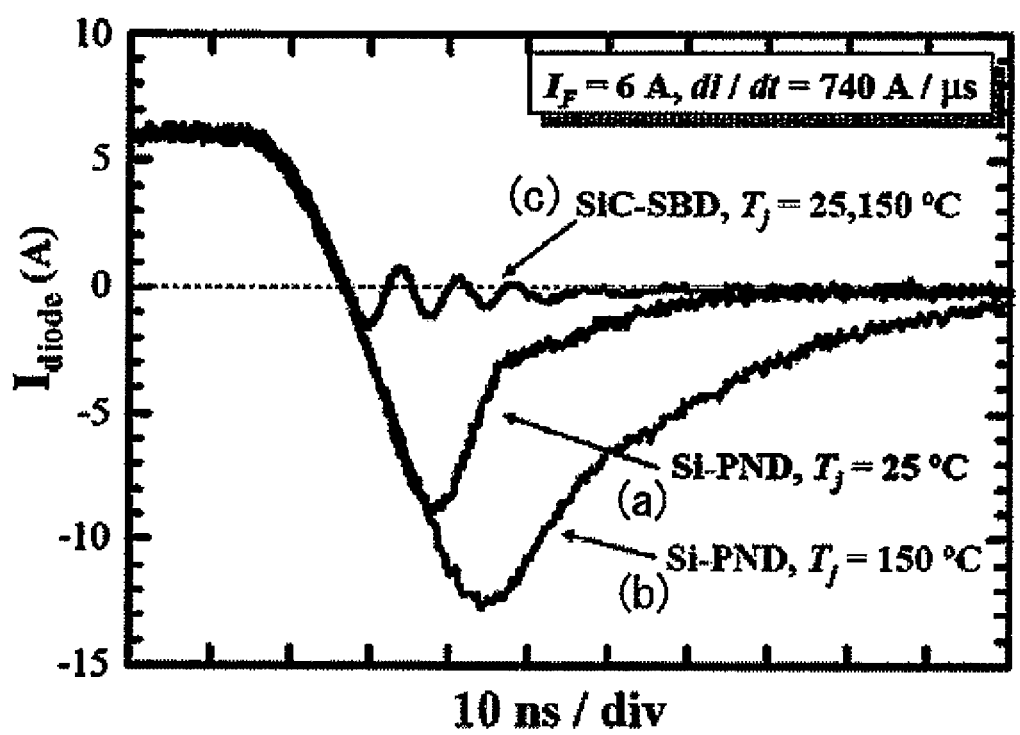
FIG. 13 A graph showing how a reverse recovery current flows in a pn junction diode.

Hereinafter, a second embodiment of a semiconductor element according to the present invention will be described. FIG. 7 is a schematic cross-sectional view illustrating a semiconductor element as the second embodiment of the present invention. This semiconductor element 100A has substantially the same structure as the semiconductor element 100 shown in FIG. 1(a). However, in this embodiment, the impurity region 104 has diffused downward to expand beyond the first body region 103a, which is a difference from the first embodiment. That is to say, the bottom 104u of the impurity region 104 is located deeper than the bottom 103au of the first body region 103a. Also, the impurity region 104 contacts with the second body region 103b.

In FIG. 7, the first body region 103a may have an average impurity concentration of $1 \times 10^{19}$ cm$^{-3}$ and a depth (thickness) of 150 nm, and the impurity region 104 may have an average impurity concentration of $5 \times 10^{19}$ cm$^{-3}$ and a depth (thickness) of 250 nm, for example. The impurity region 104 is defined by performing counter doping with respect to the first and second body regions 103a and 103b. That is to say, the impurity region 104 includes not only a dopant of the first conductivity type but also a dopant of the second conductivity type as well. In the structure shown in FIG. 1 in which the bottom of the impurity region 104 is covered with the first body region 103a, the dopant of the first conductivity type in the impurity region is compensated for by the dopant of the second conductivity type. As a result, the impurity region comes to have increased resistance accordingly. Since the average impurity concentration of the second body region 103b is set to be smaller than that of the first body region 103a, the influence of compensation made by the high-concentration dopant in the first body region can be reduced by adopting the configuration shown in FIG. 7. As a result, the increase in the resistance of the impurity region, and eventually, the increase in the ON-state resistance of the semiconductor element 100, can be minimized.

As in the first embodiment described above, a semiconductor device may be formed by arranging the semiconductor elements of this embodiment in the unit cell arrangement portions 100u1 and surrounding the unit cell arrangement portions 100u1 with the peripheral portions 100f1 as shown in FIGS. 6(a), 6(b) and 6(c).

In the embodiments of the present invention described above, silicon carbide is supposed to be 4H-SiC. However, any other poly-type (such as 6H-SiC, 3C-SiC, or 15R-SiC) may also be adopted. Also, although the principal surface is supposed to have a plane orientation that has been off-axis cut with respect to a (0001) plane, the principal surface may also be any other plane (such as a (11-20) plane, a (1-100) plane, or a (000-1) plane) or an off-axis cut plane thereof. Still alternatively, the substrate may be made of Si and the drift region may be made of silicon carbide (3C-SiC) to form a heterojunction.

INDUSTRIAL APPLICABILITY

The present invention provides a semiconductor element that can minimize a decrease in breakdown voltage and an increase in leakage current while avoiding further decreasing the crystallinity of the semiconductor element including a pn junction of SiC.

REFERENCE SIGNS LIST 100, 100A semiconductor element
101 semiconductor substrate
102 drift region
102' first silicon carbide semiconductor layer
102j JFET region
103a first body region
103b second body region
104 impurity region
105 contact region
106 second silicon carbide semiconductor layer
106c channel region
107 gate insulating film
108 gate electrode
109 first ohmic electrode
110 second ohmic electrode
111 interlevel dielectric film
112 upper interconnect electrode
113 back surface interconnect electrode

The invention claimed is:

1. A semiconductor element comprising:
a semiconductor substrate of a first conductivity type;
a first silicon carbide semiconductor layer of the first conductivity type which is arranged on the principal surface of the semiconductor substrate;
a body region of a second conductivity type which is defined in the first silicon carbide semiconductor layer;
an impurity region of the first conductivity type which is defined in the body region;
a second silicon carbide semiconductor layer of the first conductivity type which is arranged on the first silicon carbide semiconductor layer so as to be at least partially in contact with the body region and the impurity region;
a gate insulating film which is arranged on the second silicon carbide semiconductor layer;
a gate electrode which is arranged on the gate insulating film;
a first ohmic electrode which is electrically connected to the impurity region; and
a second ohmic electrode which is arranged on the back surface of the semiconductor substrate, and
wherein the body region of the second conductivity type includes a first body region that contacts with the surface of the first silicon carbide semiconductor layer and a second body region that contacts with the bottom of the body region of the second conductivity type, and
wherein the average impurity concentration of the first body region is twice or more as high as the average impurity concentration of the second body region, and
wherein the bottom of the impurity region is located at a deeper level than the bottom of the first body region.

2. The semiconductor element of claim 1, wherein supposing electric potentials applied to the second ohmic electrode and the gate electrode with respect to the electric potential of the first ohmic electrode are identified by Vds and Vgs, respectively, and a gate threshold voltage is identified by Vth, in the case where Vgs≥Vth is satisfied, current flows from the second ohmic electrode toward the first ohmic electrode via the second silicon carbide semiconductor layer, and in the case where 0 volts≤Vgs<Vth is satisfied, current flows from the first ohmic electrode toward the second ohmic electrode via the second silicon carbide semiconductor layer before current starts to flow from the body region toward the first silicon carbide semiconductor layer as Vds becomes even smaller than 0 volts.

3. The semiconductor element of claim 1, wherein the semiconductor substrate, the first silicon carbide semiconductor layer, the body region, the impurity region, the second silicon carbide semiconductor layer, the gate insulating film, the gate electrode, the first ohmic electrode, and the second ohmic electrode together form a metal-insulator-semiconductor field effect transistor, and wherein supposing the electric potential of the second ohmic electrode with respect to the electric potential of the first ohmic electrode is identified by Vds, the electric potential of the gate electrode with respect to the electric potential of the first ohmic electrode is identified by Vgs, the gate threshold voltage of the metal-insulator-semiconductor field effect transistor is identified by Vth, the direction of a current flowing from the second ohmic electrode toward the first ohmic electrode is defined to be a forward direction, and the direction of a current flowing from the first ohmic electrode toward the second ohmic electrode is defined to be a reverse direction, in the case where Vgs≥Vth, the metal-insulator-semiconductor field effect transistor makes the first and second ohmic electrodes electrically conductive with each other via the second silicon carbide semiconductor layer, and in the case where 0 volts≤Vgs<Vth, the metal-insulator-semiconductor field effect transistor functions as a diode that does not make a current flow in the forward direction but makes a current flow in the reverse direction from the first ohmic electrode toward the second ohmic electrode via the second silicon carbide semiconductor layer when Vds<0 volts, and wherein the absolute value of the turn-on voltage of the diode is smaller than the absolute value of the turn-on voltage of the body diode that is formed by the body region and the first silicon carbide semiconductor layer.

4. The semiconductor element of claim 1, wherein the first body region has an average impurity concentration of $1\times10^{18}$ $cm^{-3}$ to $1\times10^{20}$ $cm^{-3}$ and the second body region has an average impurity concentration of $1\times10^{17}$ $cm^{-3}$ to $1\times10^{19}$ $cm^{-3}$.

5. The semiconductor element of claim 1, wherein the second silicon carbide semiconductor layer is electrically connected to the impurity region and a portion of the first silicon carbide semiconductor layer that is adjacent to the first body region and is arranged on the first body region.

6. The semiconductor element of claim 5, wherein the second silicon carbide semiconductor layer has been grown epitaxially.

7. The semiconductor element of claim 1, wherein the first and second body regions have thicknesses of at least 15 nm and at least 100 nm, respectively, as measured perpendicularly to the principal surface of the semiconductor substrate.

8. The semiconductor element of claim 1, wherein when viewed perpendicularly to the principal surface of the semiconductor substrate, the first and second body regions have contours that match with each other.

\* \* \* \* \*